United States Patent [19]

Ueda et al.

[11] Patent Number: 5,479,115
[45] Date of Patent: Dec. 26, 1995

[54] SIGNAL PROCESSING DEVICE AND LEVEL CONVERTER CIRCUIT

[75] Inventors: Masahiro Ueda, Amagasaki; Yasushi Hayakawa, Itami, both of Japan

[73] Assignee: Mitsubishi Denki Kabushiki Kaisha, Tokyo, Japan

[21] Appl. No.: 388,433

[22] Filed: Feb. 14, 1995

[30] Foreign Application Priority Data

Apr. 22, 1994 [JP] Japan .................... 6-084882

[51] Int. Cl.[6] .............................. H03K 19/0175
[52] U.S. Cl. .................. 326/63; 326/75; 326/77
[58] Field of Search ................. 326/66, 77, 75, 326/80, 63

[56] References Cited

U.S. PATENT DOCUMENTS

| | | | |
|---|---|---|---|
| 4,700,087 | 10/1937 | Stroberger | 326/75 |
| 5,162,676 | 11/1992 | Aoki | 326/77 |
| 5,254,883 | 10/1993 | Eyck | 326/62 |
| 5,300,833 | 4/1994 | Oguri | 326/75 |
| 5,391,945 | 2/1995 | Hanke | 326/66 |
| 5,424,658 | 6/1995 | Sikkink | 326/77 |

OTHER PUBLICATIONS

Mitsubishi Denki Kabushiki Kaisha Technical Report, vol. 67, No. 3, 1993, "ISDN BiCMOS LSI", pp. 46–49.
National Semiconductor Corporation Product Catalog, Dec. 1990, "NGM Series ABiC BiCMOS/ECL Gate Arrays", pp. 1–11.
NEC Technical Report, vol. 43, No. 12, 1990, "BiCMOS Gate Arrays", Tsutomu Hatano, pp. 119–121 (with partial English translation).

Primary Examiner—Edward P. Westin
Assistant Examiner—Andrew Sanders
Attorney, Agent, or Firm—Oblon, Spivak, McClelland, Maier, & Neustadt

[57] ABSTRACT

There is disclosed a signal processing device which includes a pre-processing circuit (31) for performing a serial-to-parallel conversion on an intermediate signal ($M_2$) at a PECL level, the serial-to-parallel conversion at the PECL level being permitted to deal with a high frequency, and a level converter circuit (12) for performing a conversion from the ECL to PECL levels both having the same logic level width, which conversion consumes less power than a conversion between the ECL and CMOS levels having different logic level widths. The level conversion of a parallel signal requires less power consumed than a level conversion of a serial signal. The signal processing device further includes a level converter circuit (13) for performing a conversion into the CMOS level after obtaining an intermediate signal ($M_3$) which is a parallel signal. An intermediate signal ($M_4$) is at the CMOS level and has a low frequency. The signal processing device which operates at the CMOS level processes the high-frequency signal at the ECL level for reduction in consumed power.

16 Claims, 13 Drawing Sheets

SIGNAL PROCESSING DEVICE AND LEVEL CONVERTER CIRCUIT

BACKGROUND OF THE INVENTION

1. Field of the Invention

The present invention relates to a signal processing device and, more particularly, to a device for processing a signal at a level different from the levels of input and output signals. The invention also relates to a level converter circuit for converting the level of an input signal prior to the processing and for converting and outputting the level of the signal obtained by the processing.

2. Description of the Background Art

In general, an ECL level and a TTL level are often mixed when in use for an LSI in a user network interface (UNI) provided between ATM switches and an optical communication network in the Broadband Aspects of ISDN. Frequencies of signals to be processed are 19 MHz, 78 MHz, 156 MHz, and as high as 622 MHz.

When such signals are processed, it is necessary to employ a processing circuit formed by CMOS transistors for reduction in power consumption. With the current state of the art, however, it is difficult to process a signal having a frequency exceeding 200 MHz only by means of a processing circuit formed by CMOS transistors.

Accordingly, it has been proposed to apply a signal, if inputted, having a high frequency exceeding 200 MHz to a circuit at the ECL level, to produce an intermediate signal having a low frequency by serial-to-parallel conversion, and to perform predetermined signal processing on the intermediate signal by a processing circuit formed by CMOS transistors.

The potential of the logic at the ECL level is lower than that of the GND level, and the logic at the TTL level is higher than that of the GND level. Thus a level converter circuit for converting logic levels is required to process any signal at a CMOS level.

FIG. 12 is a block diagram of a signal processing device 101 for processing an input signal $S_{in1}$ having a relatively low frequency, for example 19 MHz, and an input signal $S_{in2}$ having a relatively high frequency, for example 622 MHz.

A signal processing circuit 101f performs signal processing at the CMOS level. The input signal $S_{in1}$ having the low frequency is permitted to be processed in the signal processing circuit 101f without serial-to-parallel conversion. Thus, the input signal $S_{in1}$ is applied to the signal processing circuit 101f only through a level converter circuit 101a for conversion from the TTL level to the CMOS level. After predetermined signal processing, the signal is outputted to the outside as an output signal $S_{out1}$ through a level converter circuit 101b for conversion from the CMOS level to the TTL level.

The input signal $S_{in2}$ having the high frequency is required to be received at the ECL level. Thus, an ECL input buffer 101c receives the input signal $S_{in2}$. Then, a serial-to-parallel converter circuit 101d serial-to-parallel converts the input signal $S_{in2}$ at the ECL level to provide a signal having a frequency processable by the signal processing circuit 101f. Further, a level converter circuit 101e for conversion from the ECL level to the CMOS level is provided for conversion into a signal at a level processable by the signal processing circuit 101f.

The signal processed by the signal processing circuit 101f is level converted by a level converter circuit 101g for conversion from the CMOS level to the ECL level, and is then parallel-to-serial converted at the ECL level by a parallel-to-serial converter circuit $101_h$ into the original frequency. Then an output signal $S_{out2}$ is provided through an ECL output buffer 101i.

FIG. 13 is a block diagram of another signal processing device 102 for processing the input signals $S_{in1}$ and $S_{in2}$. Signal processing is performed at a pseudo-CMOS level in the signal processing device 102. The pseudo-CMOS level (PCMOS level) represents a logic level at which logic identification is carried out at a potential lower than the GND level with the same potential difference as the CMOS level.

A level converter circuit 102a converts the input signal $S_{in1}$ at the TTL level to the PCMOS level and applies the converted signal to a signal processing circuit 102f, which in turn performs predetermined signal processing on the signal. Then a level converter circuit 102b converts the processed signal to the TTL level to provide the output signal $S_{out1}$.

An ECL input buffer 102c receives the input signal $S_{in2}$. Then a serial-to-parallel converter circuit 102d serial-to-parallel converts the input signal $S_{in2}$ at the ECL level. The ECL input buffer 102c and the serial-to-parallel converter circuit 102d may be of the same construction as the ECL input buffer 101c and the serial-to-parallel converter circuit 101d of the signal processing device 101 of FIG. 12, respectively.

A level converter circuit 102e for conversion from the ECL level to the PCMOS level is provided for conversion into a signal at a level processable by the signal processing circuit 102f. The signal processed by the signal processing circuit 102f is level converted by a level converter circuit 102g for conversion from the PCMOS level to the ECL level and is then parallel-to-serial converted at the ECL level by a parallel-to-serial converter circuit 102h into the original frequency. The output signal $S_{out2}$ is provide through an ECL output buffer 102i.

The constructions of the signal processing devices 101 and 102 are disclosed in Proceeding of the 1994 IEICE (Institute of Electronics, Information and Communication Engineers of Japan) Spring Conference (C-625, Fujiwara, et al.).

The signal processing devices 101 and 102, however, present the problem of a large amount of consumed power during level conversion.

In the signal processing device 101, the serial-to-parallel converter circuit 101d provides a parallel signal. Thus, the level converter circuit 101e is required to level convert a plurality of signals, and is also required to perform the conversion from the ECL level which has a small logic level width (potential difference) and which is a negative-potential logic level to the CMOS level which has a large logic level width and which is a positive-potential logic level, resulting in a large amount of power consumed in the level converter circuit 101e.

In the signal processing device 102, the ECL level and the PCMOS level have different widths of logic levels to be converted similarly to the signal processing device 101 but both are negative potentials. Therefore, the amount of power consumed in the level converter circuit 102e is smaller than that in the level converter circuit 101e.

The signal processing device 102 is, however, required to perform the conversion from the TTL level which has a large logic level width and which is a positive-potential logic level to the PCMOS level which has a large logic level width and which is a negative-potential logic level. In the signal processing device 101, on the other hand, the level converter circuit 101a for conversion from the TTL level to the CMOS level is formed by a CMOS circuit and, accordingly, consumes little power.

Therefore, the amount of power consumed in the level converter circuit 102a is greater than that in the level converter circuit 101a. Since a number of ports are generally required to receive the input signal $S_{in1}$ for use in the ISDN, the signal processing device 102 consumes a greater amount of power than the signal processing device 101 does.

SUMMARY OF THE INVENTION

The present invention is intended for a signal processing device receiving a first input signal having a TTL level and a second input signal having an ECL level for performing signal processing at a CMOS level to provide a first output signal having the TTL level and a second output signal having the ECL level. According to the present invention, the signal processing device comprises: (a) a first level converter circuit for level converting the fist input signal into a first intermediate signal at the CMOS level; (b) a second level converter circuit for level converting the second input signal into a second intermediate signal at a pseudo-ECL level; (c) a pre-processing circuit for serial-to-parallel converting the second intermediate signal to produce a third intermediate signal at the pseudo-ECL level; (d) a third level converter circuit for level converting the third intermediate signal into a fourth intermediate signal at the CMOS level; (e) a signal processing circuit for performing predetermined signal processing on the first intermediate signal and the fourth intermediate signal to produce a fifth intermediate signal and a sixth intermediate signal both at the CMOS level in respective corresponding relation to the first and fourth intermediate signals; (f) a fourth level converter circuit for level converting the fifth intermediate signal into the first output signal; (g) a fifth level converter circuit for level converting the sixth intermediate signal into a seventh intermediate signal at the pseudo-ECL level; (h) a post-processing circuit for parallel-to-serial converting the seventh intermediate signal to produce an eighth intermediate signal at the pseudo-ECL level; and (i) a sixth level converter circuit for level converting the eighth intermediate signal into the second output signal.

In the signal processing device of the present invention, the signal processing circuit processes the signal at the CMOS level. It is hence necessary to perform a level conversion to process the first input signal at the TTL level and the second input signal at the ECL level; The logic of the TTL level is specified at a potential of not less than 0 V, and the logic of the ECL level is specified at a potential of not more than 0 V.

Thus, little power is consumed in the first level converter circuit for performing the level conversion from the TTL level to the CMOS level. A small amount of power is consumed in the second level converter circuit for conversion from the ECL level having a small potential amplitude (logic amplitude) indicative of two different logics into the pseudo-ECL level having the same logic amplitude as the ECL level and having the logic specified at the potential of not less than 0 V.

Further, the third intermediate signal at the pseudo-ECL level having a lower frequency than the frequency of the second intermediate signal is produced prior to provision of the signal at the CMOS level having a low frequency. Then, the fourth intermediate signal at the CMOS level is obtained, and the signal processing circuit can process the fourth intermediate signal.

The second output signal at the ECL level is obtained through the reverse process on the basis of the sixth intermediate signal provided by processing in the signal processing circuit.

The signal processing device of the present invention processes signals by using the signal processing circuit for performing processing at the CMOS level without significant increase in consumed power if the second input signal at the ECL level has a high frequency. The signal processing device can also process the first input signal at the TTL level.

The present invention is also intended for a level converter circuit for converting a first signal at an ECL level into a second signal at a pseudo-ECL level. According to the present invention, the level converter circuit comprises: (a) first, second, and third power supplies for providing a first potential, a second potential lower than the first potential, and a third potential lower than the second potential, respectively; (b) a voltage-to-current converting portion between the second power supply and the third power supply and receiving a potential of the first signal for producing a conversion current varying in response to a variation in the potential of the first signal; (c) a current-to-voltage converting portion connected to the first power supply for converting the conversion current into a first intermediate potential varying within a predetermined range; (d) a first voltage follower circuit receiving the first intermediate potential for outputting a second intermediate potential; (e) a current switch receiving the second intermediate potential for outputting a third intermediate potential; and (f) a second voltage follower circuit receiving the third intermediate potential for outputting the second signal.

In the level converter circuit of the present invention, the voltage-to-current converting portion converts the transition of the first signal at the ECL level into the increase and decrease in the conversion current, which is in turn converted into the first intermediate potential by the current-to-voltage converting portion. The first intermediate potential is at the PECL level. The first voltage follower circuit impedance converts the first intermediate potential into the second intermediate potential. The current switch functions in response to the transition of the second intermediate potential to determine the third intermediate potential. The level converter circuit of the present invention functions as an input buffer while converting the ECL level signal into the PECL level signal.

Preferably, the voltage-to-current converting portion includes: (b-1) an input transistor having a base receiving the first signal, an emitter connected to the third power supply, and a collector; and (b-2) a conversion transistor having a base connected to the second power supply, an emitter connected to the collector of the input transistor, and a collector feeding the conversion current.

In the level converter circuit, since the base potential of the conversion transistor is fixed to the second potential particularly in the voltage-to-current converting portion, variations in collector potential of the input transistor is suppressed.

The increase in collector potential of the input transistor is suppressed. Thus, the magnitude of the first intermediate signal does not influence the conversion current.

Preferably, the voltage-to-current converting portion includes: (b-1) a first transistor having a collector, an emitter, and, a base receiving the first signal; (b-2) a second transistor having a base receiving a reference potential, an emitter connected to the emitter of the first transistor, and a collector; (b-3) a resistor connected between the collector of the second transistor and the second power supply; (b-4) a constant current source connected commonly to the emitter of the first transistor and the emitter of the second transistor; (b-5) a conversion transistor having an emitter connected to the collector of the first transistor, a base connected to the second power supply, and a collector carrying the conversion current; and (b-6) a third transistor having a source connected to the base of the conversion transistor, a drain connected to the emitter of the conversion transistor, and a gate connected to the collector of the second transistor.

In the level converter circuit, the first transistor, the second transistor, and the constant current source form the current switch. When the first signal is "H", the second transistor is off and the third transistor is accordingly off. More conversion current flows through the conversion transistor.

When the first signal is "L", the first transistor is off and the second transistor is on. In this case, the third transistor is on.

In the level converter circuit, the conversion current changes sharply in response to changes in the first signal, providing good responsivity, that is, good frequency characteristics. If the first input signal goes low to turn on the first transistor, the emitter of the conversion transistor is prevented from becoming floating.

Preferably, the current switch includes: (e-1) a first transistor having a collector, an emitter, and a base receiving the second intermediate potential; (e-2) a second transistor having a collector receiving the third intermediate potential, an emitter connected to the emitter of the first transistor, and a base receiving a reference potential; (e-3) a first resistor connected between the collector of the first transistor and the first power supply; (e-4) a second resistor connected between the collector of the second transistor and the first power supply; and (e-5) a constant current source connected commonly to the emitter of the first transistor and the emitter of the second transistor, and the current-to-voltage converting portion includes: (c-1) a diode having an anode connected to the first power supply and a cathode receiving the first intermediate potential; and (c-2) a third transistor having a source connected to the anode of the diode, a drain connected to the cathode of the diode, and a gate connected to the collector of the first transistor.

In the level converter circuit, when the first signal goes high, the conversion current increases and the first intermediate potential drops. Then, the second intermediate potential drops, and the collector potential of the first transistor rises. The third transistor turns off. Thus, the first intermediate potential drops sharply to a value determined by the voltage supported by the diode.

On the other hand, when the first signal goes low, the conversion current decreases and the voltage supported by the diode decreases. Then the first intermediate potential rises. The second intermediate potential accordingly rises and the third transistor turns on. Thus, the first intermediate potential rises sharply.

The level converter circuit in which the first intermediate potential changes sharply in response to the changes in the first signal has good responsivity, that is, good frequency characteristics.

Preferably, the voltage-to-current converting portion includes: (b-1) a fourth transistor having a gate receiving the first signal, a source connected to the third power supply, and a drain; and (b-2) a third resistor connected between the drain of the fourth transistor and the second power supply.

In the level converter circuit, little current flows through the gate of the fourth transistor if the potential of the first signal rises. The third resistor determines the drain potential of the fourth transistor when the potential of the first signal drops and the fourth transistor turn off.

The fourth transistor is not broken down if the potential corresponding to "H" of the first signal is higher than the ECL level. Further, the third resistor determines the drain potential of the fourth transistor when it is off, the drain of the fourth transistor is prevented from being floating.

Preferably, the voltage-to-current converting portion further includes: (b-3) a fourth resistor connected between the third resistor and the current-to-voltage converting portion.

In the level converter circuit, the first intermediate potential is applied to the first end of the fourth resistor, and the collector potential of the fourth transistor is applied to the second end of the fourth resistor.

The fourth resistor restricts the increase in collector potential of the fourth transistor, thereby avoiding breakdown of the fourth transistor.

According to another aspect of the present invention, a level converter circuit for converting a first signal at a pseudo-ECL level into a second signal at an ECL level comprises: (a) first, second, and third power supplies for providing a first potential, a second potential lower than the first potential, and a third potential lower than the second potential, respectively; (b) a current switch between the first power supply and the second power supply and receiving the first signal for producing a first intermediate potential; (c) a signal generator circuit including (c-1) a regulating transistor having an emitter, a base receiving the first intermediate potential, and a collector connected to the first power supply, and (c-2) a regulating resistor having a first end, and a second end connected to the emitter of the regulating transistor, the signal generator circuit outputting a second intermediate potential at the first end of the regulating resistor; (d) an output portion receiving the second intermediate potential for outputting the second signal; (e) a first potential variation detector circuit between the second power supply and the third power supply for applying a first current to the regulating resistor, the first current varying in response to a variation in the third potential relative to the second potential; and (f) a second potential variation detector circuit between the first power supply and the third power supply for applying a second current to the regulating resistor, the second current varying in response to a variation in the first potential relative to the third potential.

In the level converter circuit of the second aspect of the present invention, the current flowing through the regulating resistor of the signal generator circuit varies in response to variations in the third potential relative to the second potential and variations in the first potential relative to the third potential.

According to a third aspect of the present invention, the level converter circuit comprises: (a) first, second, and third power supplies for providing a first potential, a second potential lower than the first potential, and a third potential lower than the second potential, respectively; (b) a current switch between the first power supply and the second power supply and receiving the first signal for producing a first intermediate potential; (c) a signal generator circuit including (c-1) a regulating transistor having an emitter, a base receiving the first intermediate potential, and a collector connected to the first power supply, (c-2) a first regulating resistor having a first end, and a second end connected to the emitter of the regulating transistor, and (c-3) a second regulating resistor having a first end, and a second end connected to the first end of the first regulating resistor, the signal generator circuit outputting a second intermediate potential at the first end of the second regulating resistor; (d) an output portion receiving the second intermediate potential for outputting the second signal; (e) a first potential variation detector circuit between the first power supply and the second power supply for applying a first current to the first regulating resistor, the first current varying in response to a variation in the first potential relative to the second potential; and (f) a second potential variation detector circuit between the second power supply and the third power supply for applying a second current to the second regulating resistor, the second current varying in response to a variation in the third potential relative to the second potential.

In the level converter circuit of the third aspect of the present invention, the current flowing through the first regulating resistor varies in response to the variation in the first potential relative to the second potential, and the current flowing through the second regulating resistor varies in response to the variation in the third potential relative to the second potential.

According to a fourth aspect of the present invention, the level converter circuit comprises: (a) first, second, and third power supplies for providing a first potential, a second potential lower than the first potential, and a third potential lower than the second potential, respectively; (b) a current switch between the first power supply and the second power supply and receiving the first signal for producing a first intermediate potential; (c) a signal generator circuit including (c-1) a regulating transistor having an emitter, a base receiving the first intermediate potential, and a collector connected to the first power supply, and (c-2) a first regulating resistor having a first end, and a second end connected to the emitter of the regulating transistor, the signal generator circuit outputting a second intermediate potential at the first end of the first regulating resistor; (d) an output portion receiving the second intermediate potential for outputting the second signal; (e) a second regulating resistor connected between the first power supply and the current switch; (f) a first potential variation detector circuit between the first power supply and the second power supply for applying a first current to the second regulating resistor, the first Current varying in response to a variation in the first potential relative to the second potential; and (g) a second potential variation detector circuit between the second power supply and the third power supply for applying a second current to the first regulating resistor, the second current varying in response to a variation in: the third potential relative to the second potential.

In the level converter circuit of the fourth aspect of the present invention, the current flowing through the second regulating resistor varies in response to the variation in the first potential relative to the second potential, and the current flowing through the first regulating resistor varies in response to the variation in the third potential relative to the second potential.

Thus, the variations in the second signal resulting from the variations in the first and third potentials relative to the second potential are suppressed in the level converter circuit of the second to fourth aspects of the present invention.

Preferably, the second potential variation detector circuit includes: (f-1) a bias setting circuit including: (f-1-1) a current mirror circuit having a first branch, and a second branch feeding current proportional to current flowing through the first branch, the first branch and the second branch being connected commonly to the third power supply, and (f-1-2) a third regulating resistor connected between the first branch of the current mirror circuit and the second power supply; and (f-2) a third potential variation detector circuit between the second power supply and the third power supply for drawing current responsive to a variation in the third potential from the third regulating resistor. In the level converter circuit, the third potential variation detector circuit draws a part of the current flowing through the third regulating resistor in response to the variation in the third potential relative to the second potential. Thus, the current flowing through the first branch of the bias setting circuit is influenced by the current fed by the third potential variation detector circuit.

The variation in the second signal resulting from the variation in the third potential relative to the second potential is suppressed.

Preferably, the second potential variation detector circuit includes: (f-1) a bias setting circuit including: (f-1-1) a current mirror circuit having a first branch, and a second branch feeding current proportional to current flowing through the first branch, the first branch and the second branch being connected commonly to the third power supply, and (f-1-2) a third regulating resistor connected between the first branch of the current mirror circuit and the second power supply; and (f-2) a third potential variation detector circuit between the second power supply and the third power supply for drawing current responsive to a variation in the third potential from the third regulating resistor.

In the level converter circuit, the third potential variation detector circuit draws a part of the current flowing through the second regulating resistor in response to the variation in the third potential relative to the second potential. Thus, the current flowing through the first branch of the bias setting circuit is influenced by the current fed by the third potential variation detector circuit.

The variation in the second signal resulting from the variation in the third potential relative to the second potential is suppressed.

Preferably, the output portion includes: (d-1) a first output transistor having a base receiving the second intermediate potential, a collector connected to the first power supply, and an emitter; and (d-2) a second output transistor having a base connected to the emitter of the first output transistor, a collector connected to the second power supply, and an emitter outputting the second signal. In the level converter circuit, the first output transistor drives the second output transistor. The first and second transistors output the second signal in two steps, thereby providing a large current as the second signal.

It is therefore an object of the present invention to provide a signal processing device which is capable of processing a signal having a frequency higher than the frequency processable by a CMOS signal processing circuit and capable of consuming less power.

These and other objects, features, aspects and advantages of the present invention will become more apparent from the following detailed description of the present invention when take in conjunction with the accompanying drawings.

DESCRIPTION OF THE PREFERRED EMBODIMENTS

Figure 1:
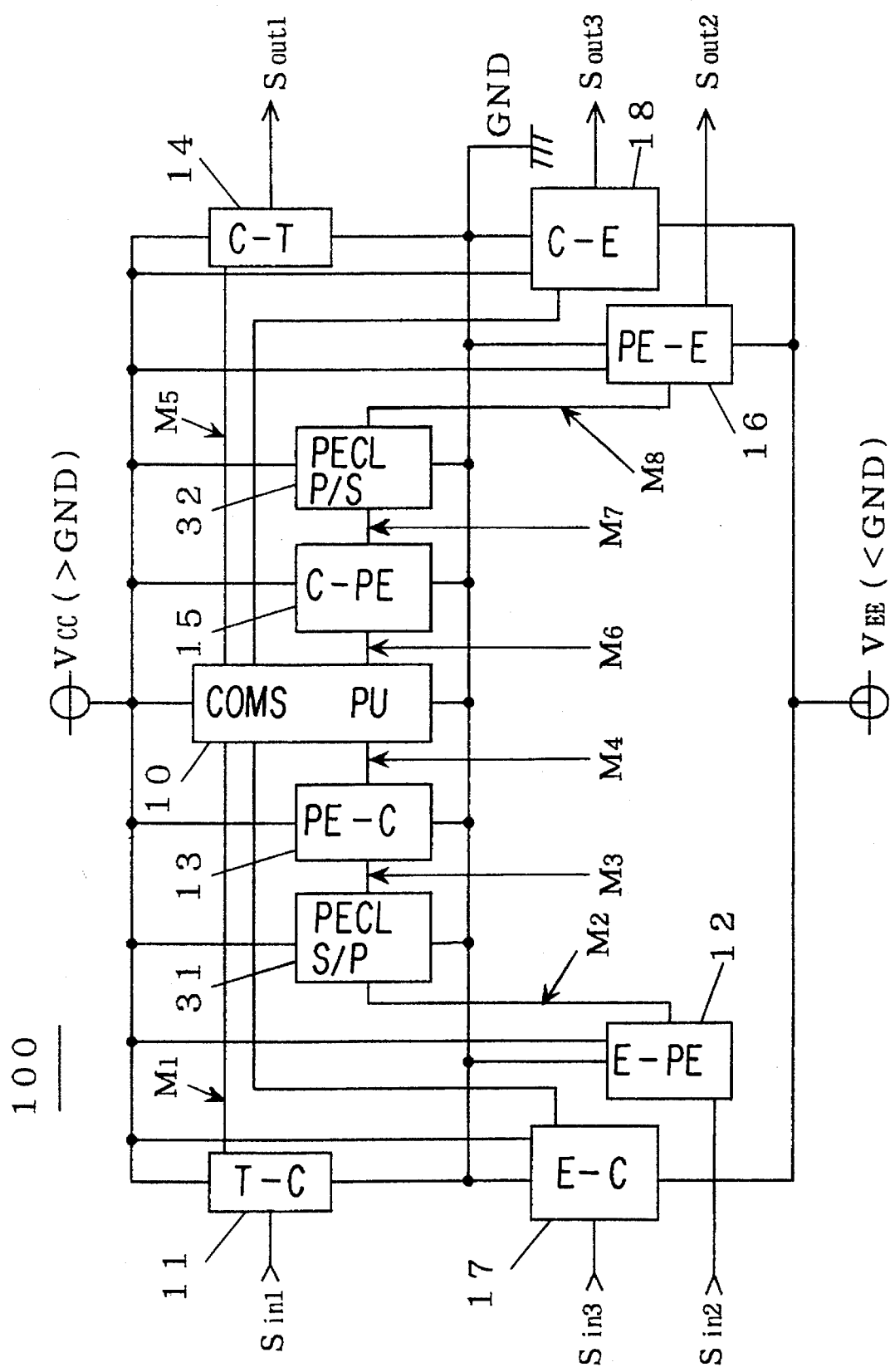
FIG. 1 is a block diagram of a signal processing device 100 according to a first preferred embodiment of the present invention.

A. Preferred Embodiment of Signal Processing Device (a-1) First Preferred Embodiment FIG. 1 is a block diagram of a signal processing device 100 according to the present invention. The signal processing device 100 receives an input signal having a TTL level and an input signal $S_{in2}$ having an ECL level and performs signal processing at a CMOS level to output an output signal $S_{out1}$ having the TTL level and an output signal $S_{out2}$ having the ECL level. The signal processing device 100 is connected to three power supplies and receives potentials $V_{CC}$, GND, $V_{EE}$ where $V_{CC}$>GND>$V_{EE}$. For example, $V_{CC}$=3.3 V, GND=0 V, and $V_{EE}$=−2.0 V.

In the signal processing device 100, a level converter circuit 11 level converts the input signal $S_{in1}$ to provide an intermediate signal $M_1$ at the CMOS level. A signal processing circuit 10 for performing signal processing at the CMOS level performs predetermined signal processing on the intermediate signal $M_1$ to provide an intermediate signal $M_5$. A level converter circuit 14 level converts the intermediate signal $M_5$ to output the output signal $S_{out1}$.

A level converter circuit level converts the input signal $S_{in2}$ to provide an intermediate signal $M_2$ at a pseudo-ECL (PECL) level. The PECL level represents a logic level at which logic identification is carried out at a potential higher than the GND level with the same potential difference as the ECL level. Specifically, when the logics "H" and "L", at the ECL level are GND—0.8 V and GND—1.6 V, respectively, the logics "H" and "L" at the PECL level are $V_{CC}$—0.8 V and $V_{CC}$—1.6 V, respectively.

A pre-processing circuit 31 serial-to-parallel converts the intermediate signal $M_2$ into an intermediate signal $M_3$ which is parallel and is held at the PECL level. A level converter circuit 13 then level converts the intermediate signal $M_3$ into an intermediate signal $M_4$ at the CMOS level.

The signal processing circuit 10 performs predetermined signal processing upon the intermediate signal $M_4$ to produce an intermediate signal $M_6$. A level converter circuit 15 level converts the intermediate signal $M_6$ into an intermediate signal $M_7$ at the PECL level. A post-processing circuit 32 parallel-to-serial converts the intermediate signal $M_7$ to provide an intermediate signal $M_8$.

The intermediate signal $M_8$ is applied to a level converter circuit 16, which in turn level converts the intermediate signal $M_8$ into the ECL level to output the output signal $S_{out2}$.

The signal processing device 100 receives a signal having a relatively low frequency, for example 19 MHz, as the input signal $S_{in1}$. Since the signal processing circuit 10 formed by a CMOS transistor can deal with a frequency of about 19 MHz, the signal is inputted at the TTL level. Level conversion from the TLL level to the CMOS level consumes little power. Thus, a small amount of power is consumed when the output signal $S_{out1}$ is produced from the input signal $S_{in1}$ through the intermediate signals $M_1$ and $M_5$.

On the other hand, the signal processing device 100 receives a signal having a relatively high frequency, for example 622 MHz, as the input signal $S_{in2}$. Since it is difficult for circuit operation at the TTL level to respond to such a high frequency, the signal is inputted at the ECL level. However, the signal processing circuit 10 is not permitted to directly process the signal at the ECL level for two reasons. One of the reasons is that the frequency characteristics of the signal processing circuit 10 are not permitted to deal with such a high frequency. The second reason is different logic levels.

To meet the first reason, the pre-processing circuit 31 and the post-processing circuit 32 perform the serial-to-parallel conversion and the parallel-to-serial conversion, respectively. For example, the serial-to-parallel conversion converts the intermediate signal $M_2$ in the ratio of 1:8 to produce the intermediate signal $M_3$.

The parallel-to-serial conversion converts the intermediate signal $M_7$ in the ratio of 8:1 to produce the intermediate signal $M_8$.

To meet the second reason, the conversion from the ECL level to the CMOS level is executed in two steps. The first step is a conversion from the ECL level prior to the serial-to-parallel conversion to the PECL level by the level converter circuit 12, and the second step is a conversion from the PECL level after the serial-to-parallel conversion to the CMOS level by the level converter circuit 13.

The serial-to-parallel conversion of the frequency as high as 622 MHz is required to be performed at the ECL level. However, a large amount of power is consumed when the level conversion is executed from the ECL level after the serial-to-parallel conversion to the CMOS level (as discussed above with respect to the signal processing device 101).

Hence, the signal processing device 100 performs the serial-to-parallel conversion at the PECL level having the same logic level width as the ECL level. The serial-to-parallel conversion at the PECL level can deal with a high frequency.

The level converter circuit 12 executes the conversion from the ECL level to the PECL level, the ECL and PECL levels having the same logic level width, and this conversion requires consumed power less than does the conversion from the ECL level to the and CMOS level, the ECL and CMOS levels having different logic level widths, for example, by the level converter circuit 101e. In addition, the level converter circuit 12 performs the level conversion upon the parallel signal rather than the level conversion upon the serial signal, requiring a small amount of power consumed.

After the intermediate signal $M_3$ which is a parallel signal is obtained, the level converter circuit 13 converts the signal to the CMOS level. The intermediate signal $M_3$ given by the serial-to-parallel conversion has the frequency of 78 MHz, for example, and is processable at the CMOS level in terms of frequency. To enable processing at the CMOS level in terms of level, the level converter circuit 13 produces the intermediate signal $M_4$. The power required for conversion from the PECL level to the CMOS level is substantially equal to the power required for the level converter circuit 102e of the signal processing device 102. From the viewpoint of only the processing of the input signal $S_{in2}$, the signal processing device 102 consumes less power than does the signal processing device 100 of the present invention. However, power required for the signal processing device 100 to process the input signal $S_{in1}$ is less than that for the signal processing device 102. From the viewpoint of the entire signal processing device, the signal processing device 100 requires a smaller amount of power consumed than the signal processing device 102 does.

Operation of the level converter circuit 11 and power required for the operation will be described below in relation to the processing of the input signal $S_{in1}$.

Figure 2:
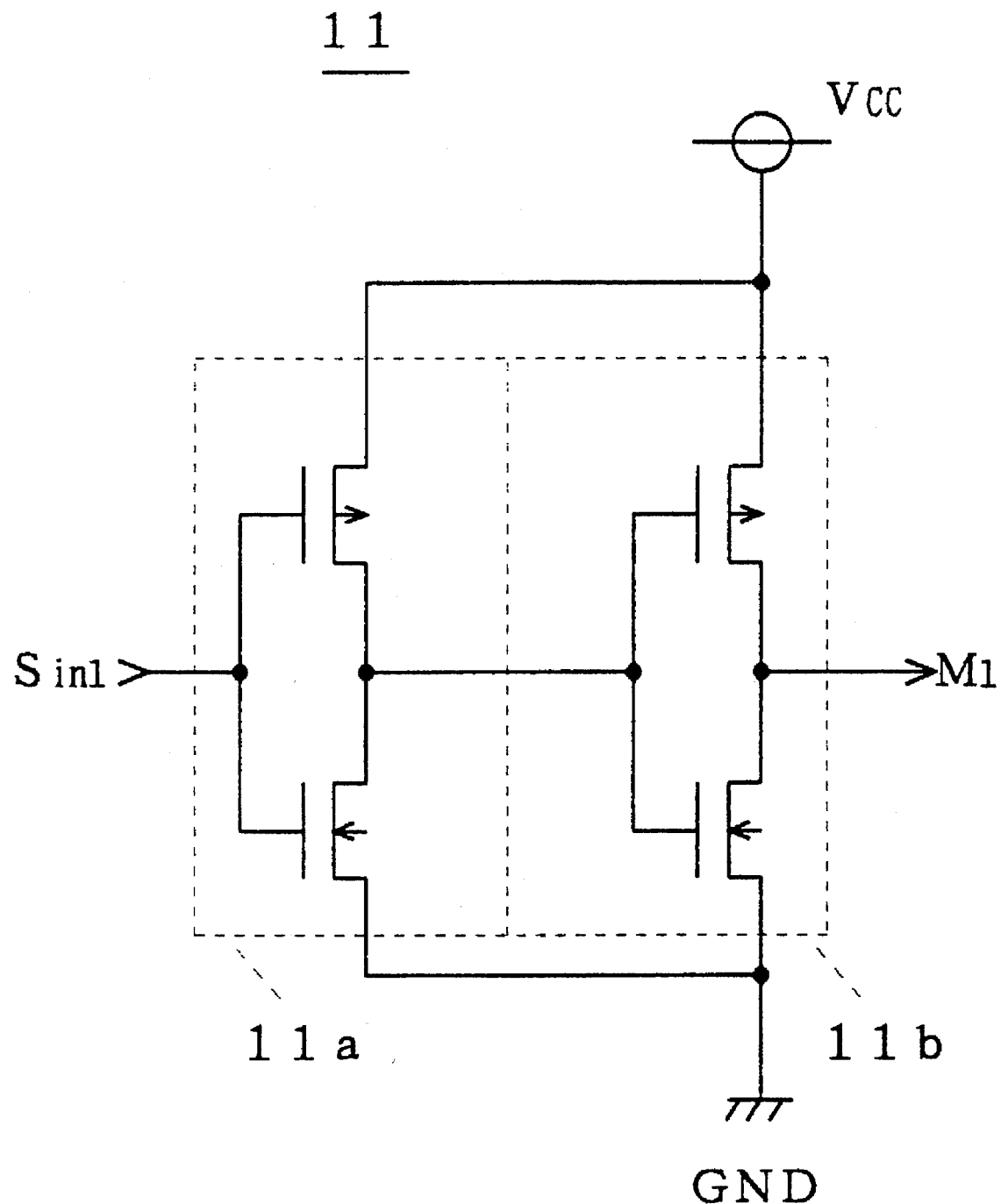
FIG. 2 is a circuit diagram of a level converter circuit 11.
Figure 3:
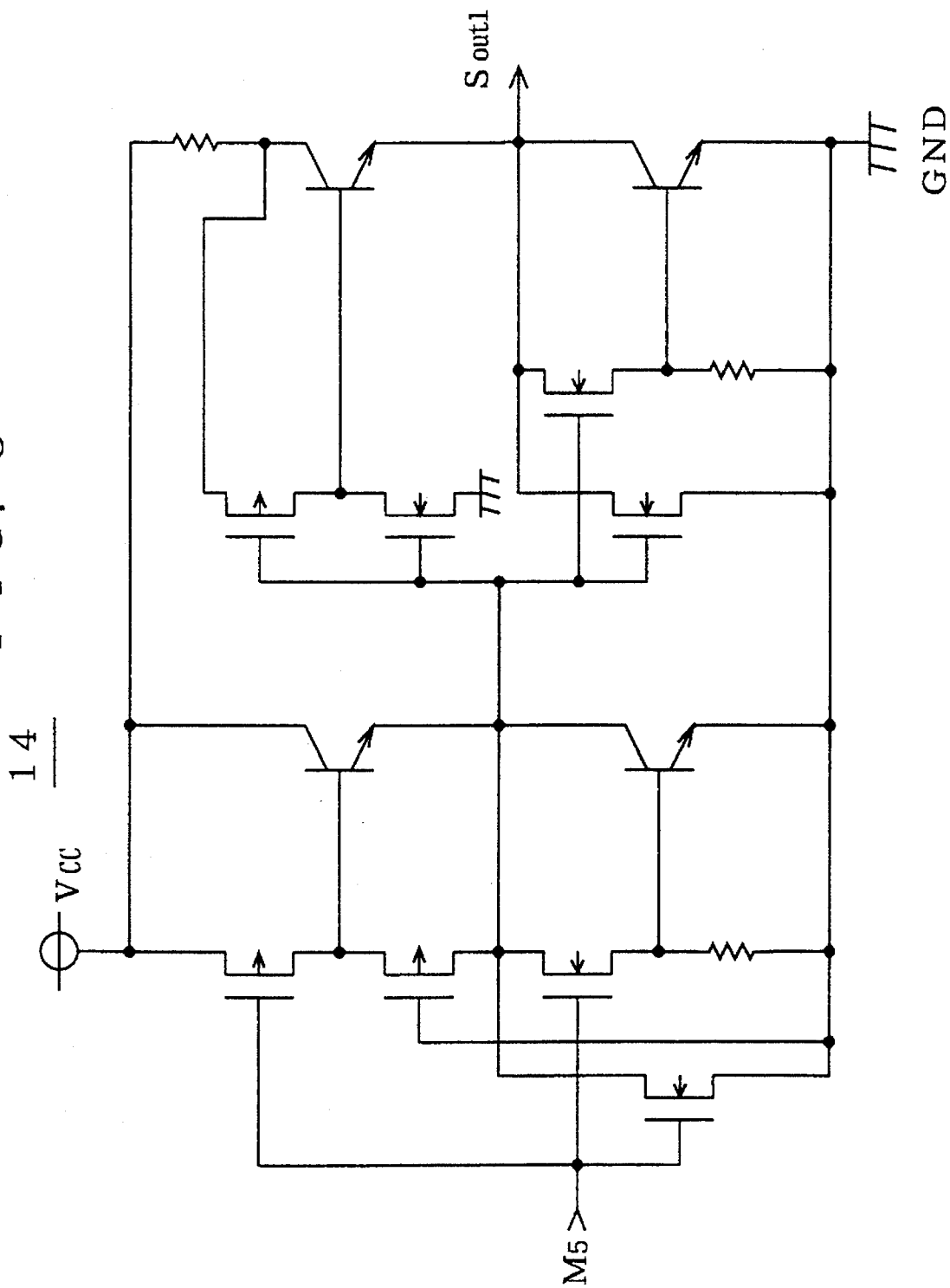
FIG. 3 is a circuit diagram of a level converter circuit 14.

FIG. 2 is a circuit diagram of the level converter circuit 11. The level converter circuit 11 comprises two CMOS inverters 11a and 11b connected in series. Since the TTL and CMOS levels differ only in threshold potential, conversion from the TTL level to the CMOS level is executed by adjusting the size of transistors forming the CMOS inverter 11b. The level converter circuit 11 having such a construction requires a small amount of power. FIG. 3 is a circuit diagram of the level converter circuit 14.

The intermediate signal $M_6$ provided by the processing of the signal processing circuit 10 is converted to the intermediate signal $M_7$ at the PECL level by the;level converter circuit 15 since processing at the PECL level is needed for parallel-to-serial conversion into the frequency as high as 622 MHz. Then the post-processing circuit 32 performs the parallel-to-serial conversion, and the level converter circuit 16 provides the output signal $S_{out2}$ at the ECL level.

Figure 4:
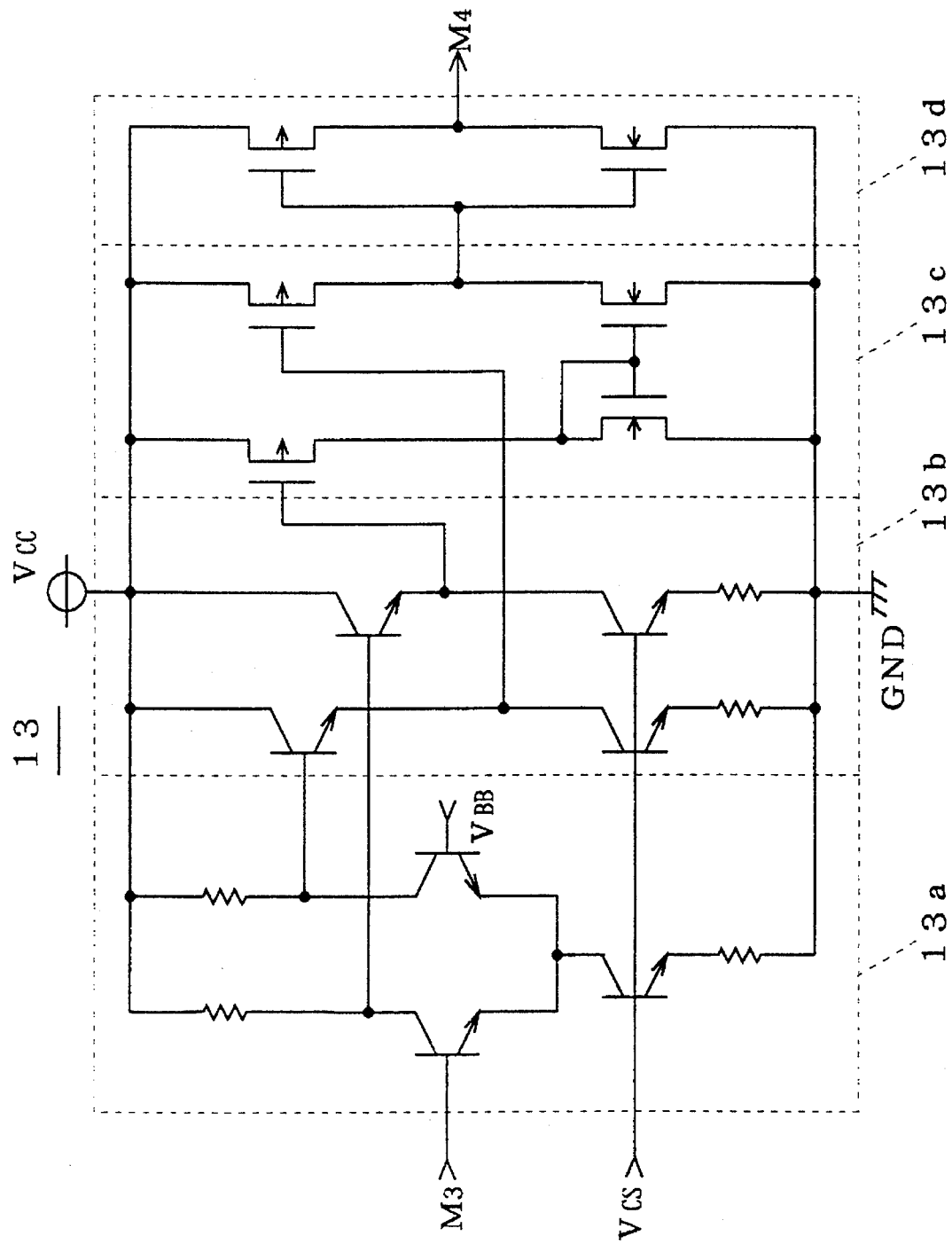
FIG. 4 is a circuit diagram of a level converter circuit 13.

FIG. 4 is a circuit diagram of the level converter circuit 13. The level converter circuit 13 comprises a current switch 13a, a voltage follower 13b, a CMOS current mirror circuit 3c, and a CMOS inverter 13d.

Figure 5:
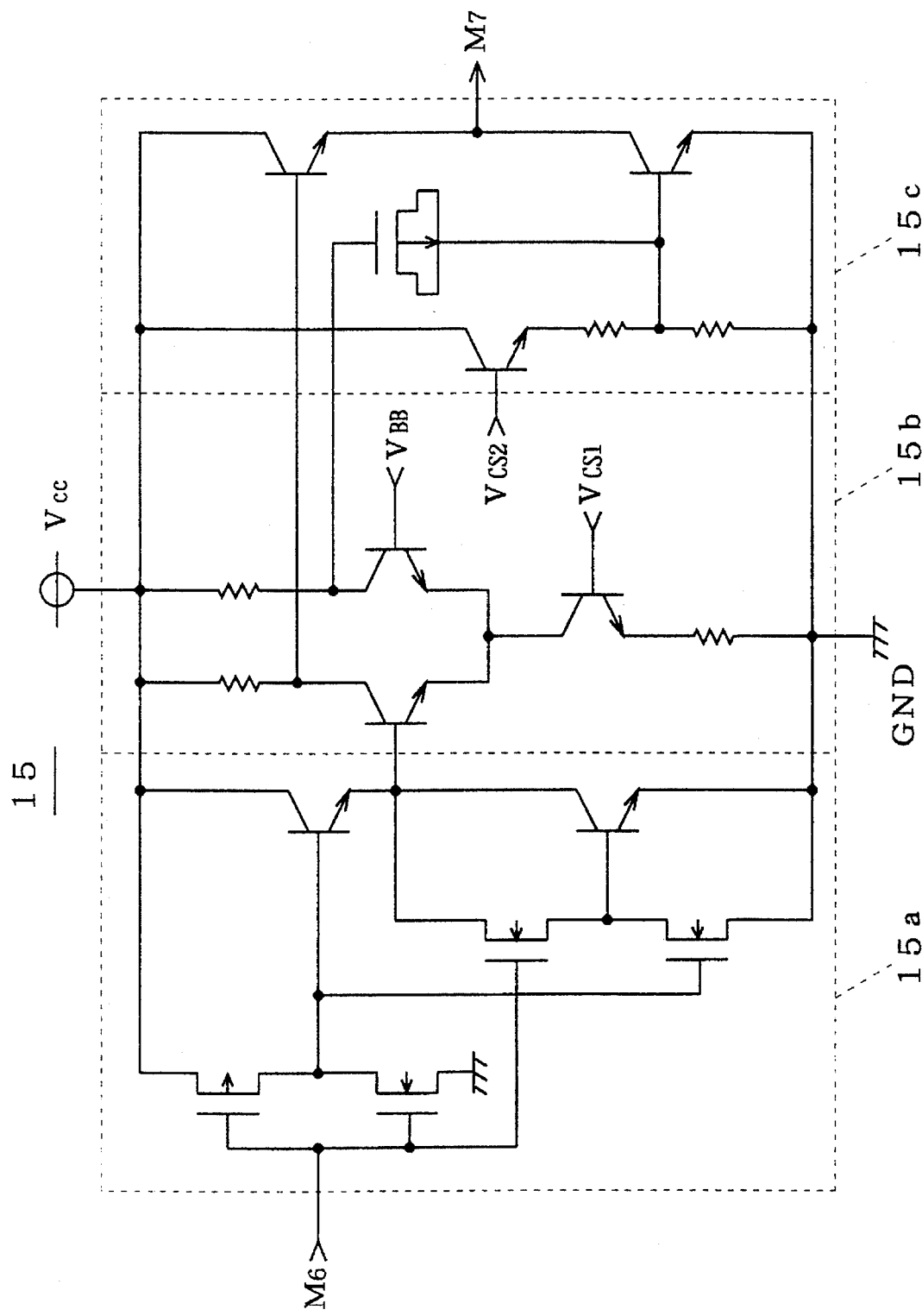
FIG. 5 is a circuit diagram of a level converter circuit 15.

FIG. 5 is a circuit diagram of the level converter circuit 15. The level converter circuit 15 comprises an input portion 15a, a current switch 15b, and an active pull-down portion 15c.

The signal processing device 100 which operates as above described can perform the predetermined processing upon the input signal $S_{in2}$ applied at a high frequency and at the ECL level to output the output signal $S_{out2}$ if the processing in the signal processing circuit 10 is performed at the CMOS level. Further, the consumed power in the signal processing device 100 is less than that in the conventionally proposed signal processing devices 101 and 102.

Signals having frequencies higher than the frequency of the input signal $S_{in1}$ and lower than the frequency of the input signal $S_{in2}$, for example 78 MHz and 156 MHz, are subjected to the signal processing by in the signal processing circuit 10 without the serial-to-parallel conversion, and are transmitted at the ECL level. The signal processing device 100 can deal with such signals as an input signal $S_{in3}$.

A level converter circuit 17 level converts the input signal $S_{in3}$ from the ECL level to the CMOS level, and the signal processing circuit 10 performs signal processing upon the level-converted signal. Then a level converter circuit 18 level converts the processed signal from the CMOS level to the ECL level to output an output signal $S_{out3}$.

Relation between the respective elements of the first preferred embodiment and those of claim 1 will be described. The input signals $S_{in1}$, $S_{in2}$, and $S_{in3}$ correspond to a first input signal, a second input signal, and a third input signal of claim 1, respectively. The output signals $S_{out1}$, $S_{out2}$, and $S_{out3}$ correspond to a first output signal, a second output signal, and a third output signal, respectively. The level converter circuits 11 to 16 correspond to first to sixth level converter circuits, respectively. The intermediate signals $M_1$ to $M_8$ correspond to first to eighth intermediate signals, respectively.

Figure 6:
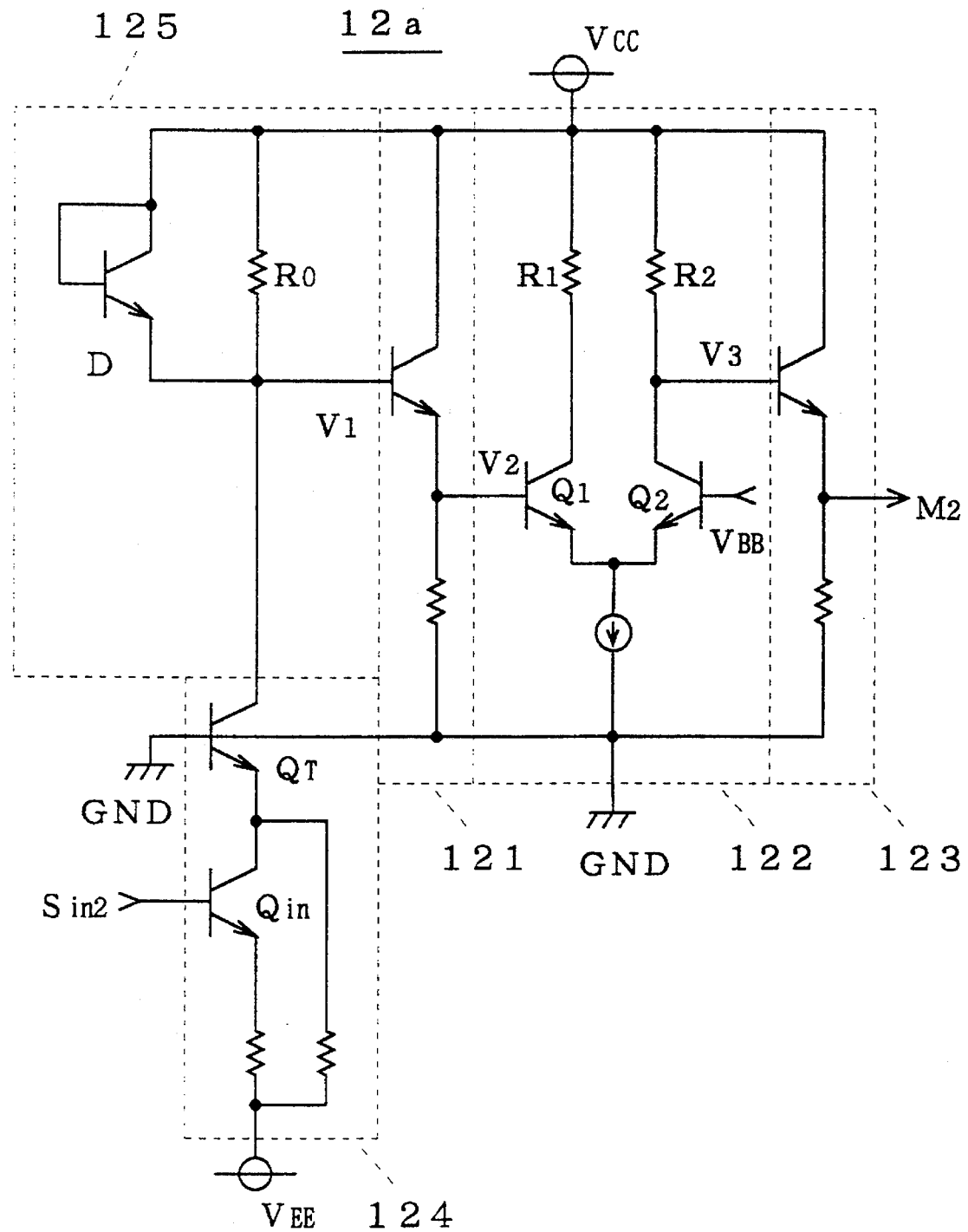
FIG. 6 is a circuit diagram of a level converter circuit 12a according to a second preferred embodiment of the present invention.

B. Level Converter Circuit for ECL-to-PECL Conversion
(b-1) Second Preferred Embodiment FIG. 6 is a circuit diagram of a level converter circuit 12a which is a preferred embodiment of the level converter circuit 12 in the signal processing device 100. The level converter circuit 12a comprises a voltage-to-current converter circuit 124, a current-to-voltage converter circuit 125, voltage follower circuits 121, 123, and a current switch 122.

The input signal $S_{in2}$ at the ECL level is applied to the voltage-to-current converter circuit 124, which in turn provides a conversion current. The amount of the conversion current varies in response to "H" and "L" changes of the input signal $S_{in2}$. The current-to-voltage converter circuit 125 converts the conversion current into a first intermediate potential $V_1$ varying with a predetermined logic width. The first intermediate potential $V_1$ is converted into a second intermediate potential $V_2$ through the voltage follower circuit 121, and the second intermediate potential $V_2$ is applied to the current switch 122. The current switch 122 compares the second intermediate potential $V_2$ with a reference potential $V_{BB}$ to produce a third intermediate potential $V_3$. The voltage follower circuit 123 converts the third intermediate potential $V_3$ into the second intermediate signal $M_2$ at the PECL level.

The voltage-to-current converter circuit 124 includes an input transistor $Q_{in}$ and a conversion transistor $Q_T$ having an emitter connected to the collector of the input transistor $Q_{in}$. The collector and emitter of the input transistor $Q_{in}$ are connected respective first end of separate resistors. The potential $V_{EE}$ is applied to the respective second end of the resistors. The conversion transistor $Q_T$ has a base grounded (receiving the potential GND), and a collector outputting the conversion current.

When the input signal $S_{in2}$ is "H", the input transistor $Q_{in}$ applies a large current to the emitter of the conversion transistor $Q_T$. This causes a large conversion current to flow through ? the collector of the conversion transistor $Q_T$. On the other hand, when the input signal $S_{in2}$ is "L", a small conversion current flows through the collector of the conversion transistor $Q_T$.

The current-to-voltage converter circuit 125 includes a diode D and a resistor $R_0$ which are connected in parallel. The diode D has an anode receiving the potential $V_{CC}$ and a cathode connected to the collector of the conversion transistor $Q_T$ of the voltage-to-current converter circuit 124. The first intermediate potential $V_1$ is provided at the cathode of the diode D. When the conversion current is small, the first intermediate potential $V_1$ is lower than the potential $V_{CC}$ by the amount of a voltage drop in the resistor $R_0$. When the conversion current is large, the first intermediate potential $V_1$ is lower than the potential $V_{CC}$ by the amount of a voltage supported by the diode D. Thus, the first intermediate potential $V_1$ drops as the conversion current increases.

Since the base potential of the conversion transistor $Q_T$ is fixed to the potential GND, variations in the first intermediate potential $V_1$ do not influence the operation of the input transistor $Q_{in}$.

The current switch 122 is connected between the voltage follower circuits 121 and 123 which perform an impedance conversion. The current switch 22 includes a transistor $Q_1$ having a base receiving the second intermediate potential $V_2$ and a transistor $Q_2$ having a base receiving the reference potential $V_{BB}$. A resistor $R_1$ is connected between the collector of the transistor $Q_1$ and the power supply providing the potential $V_{CC}$, and a resistor $R_2$ is connected between the collector of the transistor $Q_2$ and the power supply providing the potential $V_{CC}$. The emitters of the transistors $Q_1$ and $Q_2$ are commonly connected to a constant current source. The voltage follower circuit 123 is connected to a connection point of the resistor $R_2$ and the collector of the transistor $Q_2$.

As the first intermediate potential $V_1$ rises, the third intermediate potential $V_3$ rises which is a collector potential of the transistor $Q_2$. As the first intermediate potential $V_1$ drops, the third intermediate potential $V_3$ drops. Thus, the logic of the second intermediate signal; $M_2$ and the logic of the input signal $S_{in2}$ are complementary. That is, the level converter circuit 12a is an input buffer serving as an inverter.

(b-2) Third Preferred Embodiment

Figure 7:
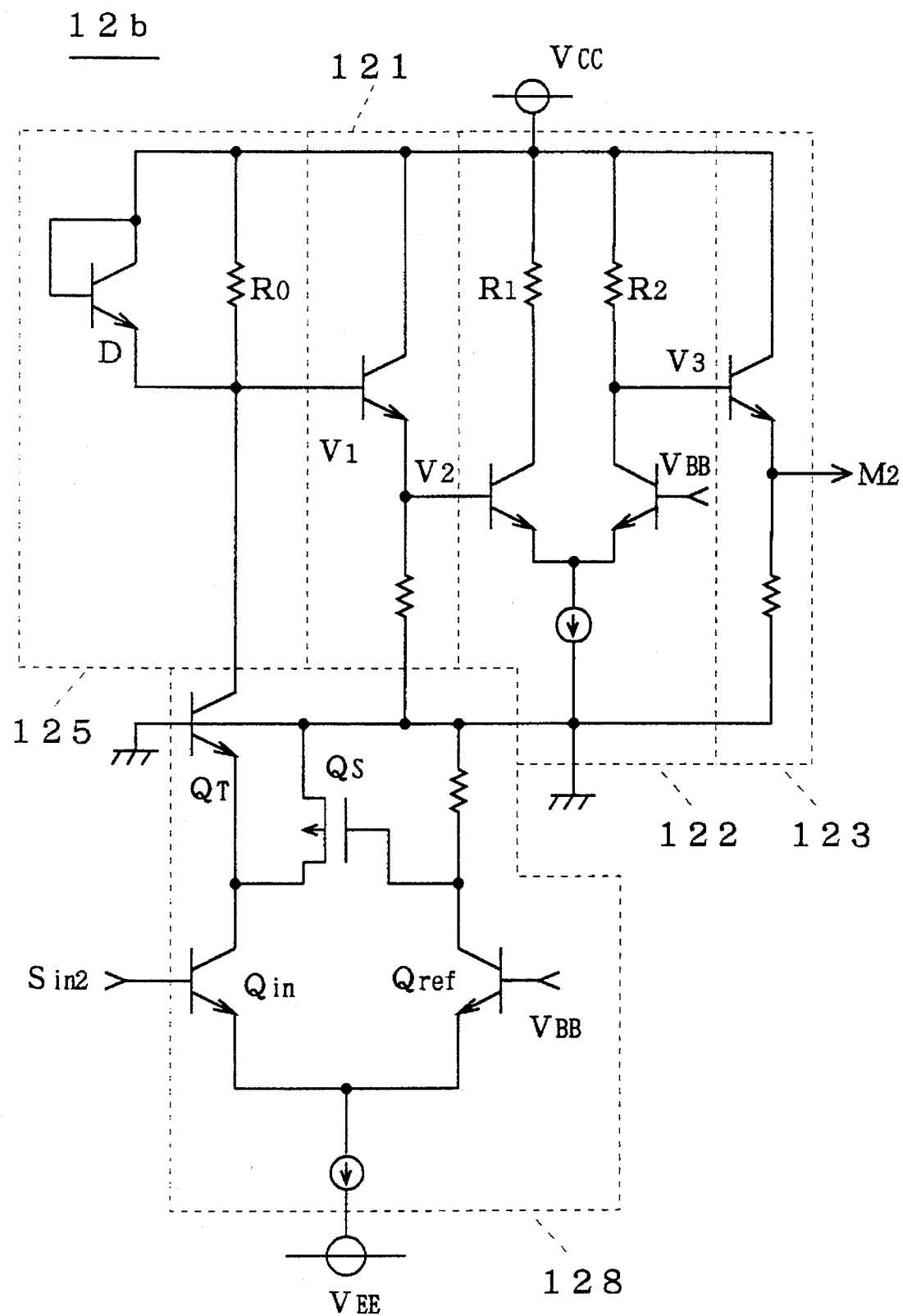
FIG. 7 is a circuit diagram of a level converter circuit 12b according to a third preferred embodiment of the present invention.

FIG. 7 is a circuit diagram of a level converter circuit 12b which is another preferred embodiment of the level converter circuit 12 in the signal processing device 100. The level converter circuit 12b comprises a voltage-to-current converter circuit 128 substituted for the voltage-to-current converter circuit 124 of the level converter circuit 12a. The voltage-to-current converter circuit 128 includes the input transistor $Q_{in}$ having the base receiving the input signal $S_{in2}$, a transistor $Q_{ref}$ receiving the reference potential $V_{BB}$, the conversion transistor $Q_T$, and a PMOS transistor $Q_S$.

The emitter of the conversion transistor $Q_T$ is connected to the collector of the input transistor $Q_{in}$ in the same manner as that in the level conversion circuit 12a. Hence, the conversion current is large when the input signal $S_{in2}$ is "H" and it is small when the input signal $S_{in2}$ is "L". The emitters of the input transistor $Q_{in}$ and the transistor $Q_{ref}$ are commonly connected to the constant current source, and the transistors $Q_{in}$ and $Q_{ref}$ and the constant current source form a current switch. Thus, the conversion current changes sharply in response to the transition of the input signal $S_{in2}$. Therefore, the frequency characteristics in operation are improved.

In this case, an "H" to "L" transition of the input signal $Sin_2$ causes the input transistor $Q_{in}$ to turn off but causes the transistor $Q_S$ to turn on, preventing the emitter of the conversion transistor $Q_T$ from becoming floating.

(b-3) Fourth Preferred Embodiment

Figure 8:
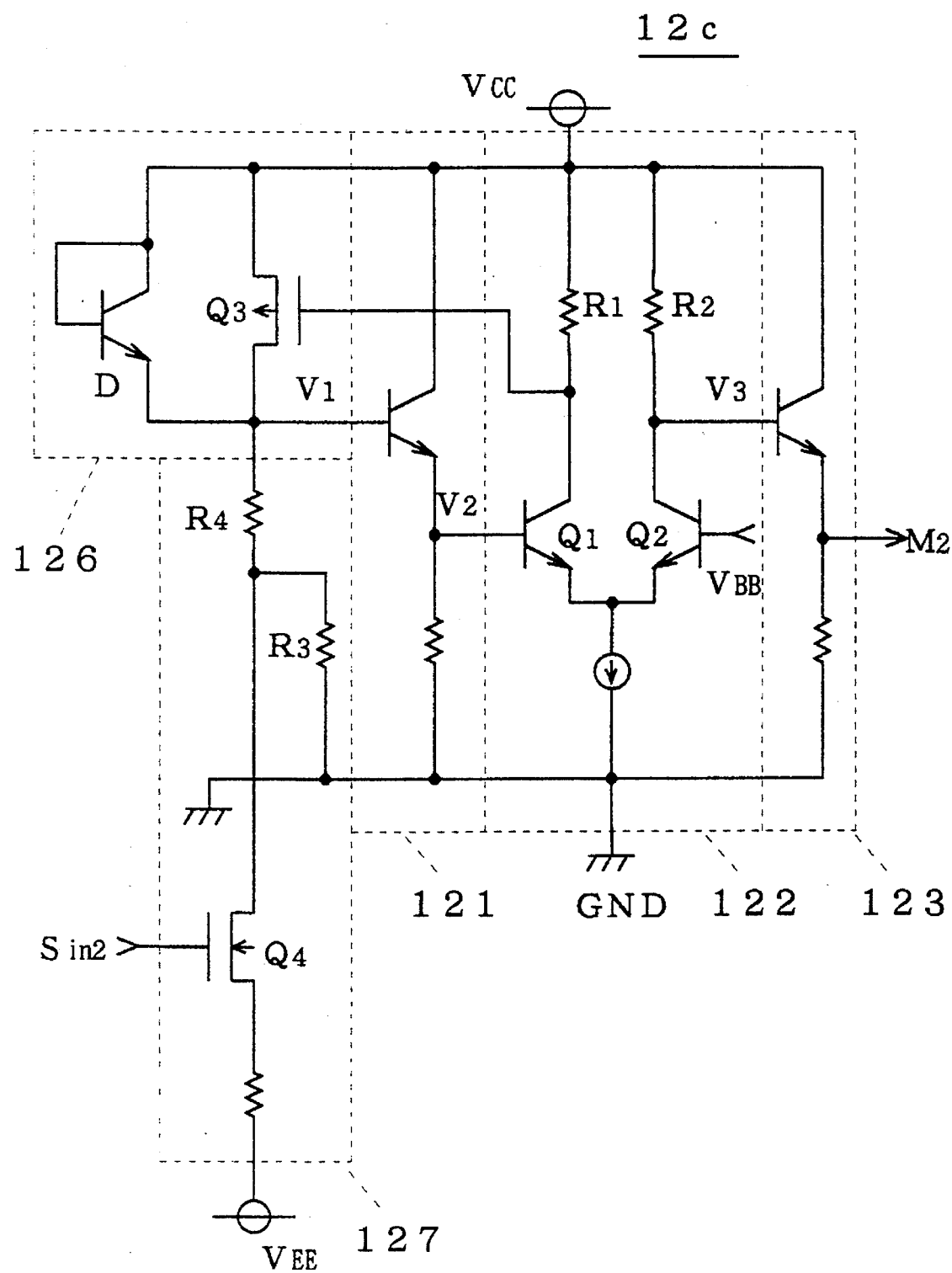
FIG. 8 is a circuit diagram of a level converter circuit 12c according to a fourth preferred embodiment of the present invention.

FIG. 8 is a circuit diagram of a level converter circuit 12c which is still another preferred embodiment of the level converter circuit 12 in the signal processing device 100. The level converter circuit 12c comprises a voltage-to-current converter circuit 127 substituted for the voltage-to-current converter circuit 124 of the level converter circuit 12a, and a current-to-voltage converter circuit 126 substituted for the current-to-voltage converter circuit 125 of the level converter circuit 12a.

The voltage-to-current converter circuit 127 includes an NMOS transistor $Q_4$ having a gate receiving the input signal $S_{in2}$, and resistors $R_3$ and $R_4$ having respective first end connected commonly to the drain of the NMOS transistor $Q_4$. A second end of the resistor $R_3$ receives the potential GND, and a second end of the resistor $R_4$ is connected to the current-to-voltage converter circuit 126. Similar to the voltage-to-current converter circuits 124, 128, the voltage-to-current converter circuit 127 obtains the conversion current which increases as the potential of the input signal $S_{in2}$ increases. The conversion current flows through the resistor $R_4$.

A large current does not flow in the level converter circuit 12c since the NMOS transistor $Q_4$ receives the input signal $S_{in2}$. Thus, the NMOS transistor $Q_4$ is not broken down if a potential corresponding to "H" of the input signal $S_{in2}$ is higher than specifications. When the input signal $S_{in2}$ goes low and the NMOS transistor $Q_4$ turns off, the drain of the NMOS transistor $Q_4$ is grounded through the resistor $R_3$, and thus the NMOS transistor $Q_4$ is not broken down.

The current-to-voltage converter circuit 126 includes the diode D and a PMOS transistor $Q_3$ which are connected in parallel. The anode of the diode D is connected to the source of the PMOS transistor $Q_3$, and the cathode of the diode D is connected to the drain of the PMOS transistor $Q_3$. The second end of the resistor $R_4$ is connected to the cathode of the diode D, and the first intermediate potential $V_1$ is provided at the connection point thereof.

When the conversion current is large and the first intermediate potential $V_1$ is lower than the potential $V_{CC}$ by the amount of the voltage supported by the diode D, the collector potential of the transistor $Q_1$ of the current switch 122 rises. The PMOS transistor $Q_3$ is off, and the first intermediate potential $V_1$ is determined only by a cut-in voltage of the diode D.

On the other hand, as the conversion current decreases, the voltage supported by the diode D drops and the first intermediate potential $V_1$ rises. Then the collector potential of the transistor $Q_1$ of the current switch 122 drops. Accordingly, the PMOS transistor $Q_3$ turns on to cause the first intermediate potential $V_1$ to rise sharply.

In this manner, the resistance of the element connected in parallel with the diode D varies so that positive feedback is provided to the magnitude of the first intermediate potential $V_1$, thereby improving the frequency characteristics in operation.

It should be noted that, since the resistor $R_4$ is connected between the drain of the PMOS transistor $Q_3$ and the NMOS transistor $Q_4$, turning on of the PMOS transistor $Q_3$ does not cause the drain potential of the NMOS transistor $Q_4$ to rise excessively, preventing the NMOS transistor $Q_4$ from being broken down.

The input signal $S_{in2}$ of the second to fourth preferred embodiments corresponds to a first signal of claims 3 to 8, and the second intermediate signal $M_2$ corresponds to a second signal. The potentials $V_{CC}$, GND, and $V_{EE}$ correspond to first, second, and third potentials, respectively.

Figure 9:
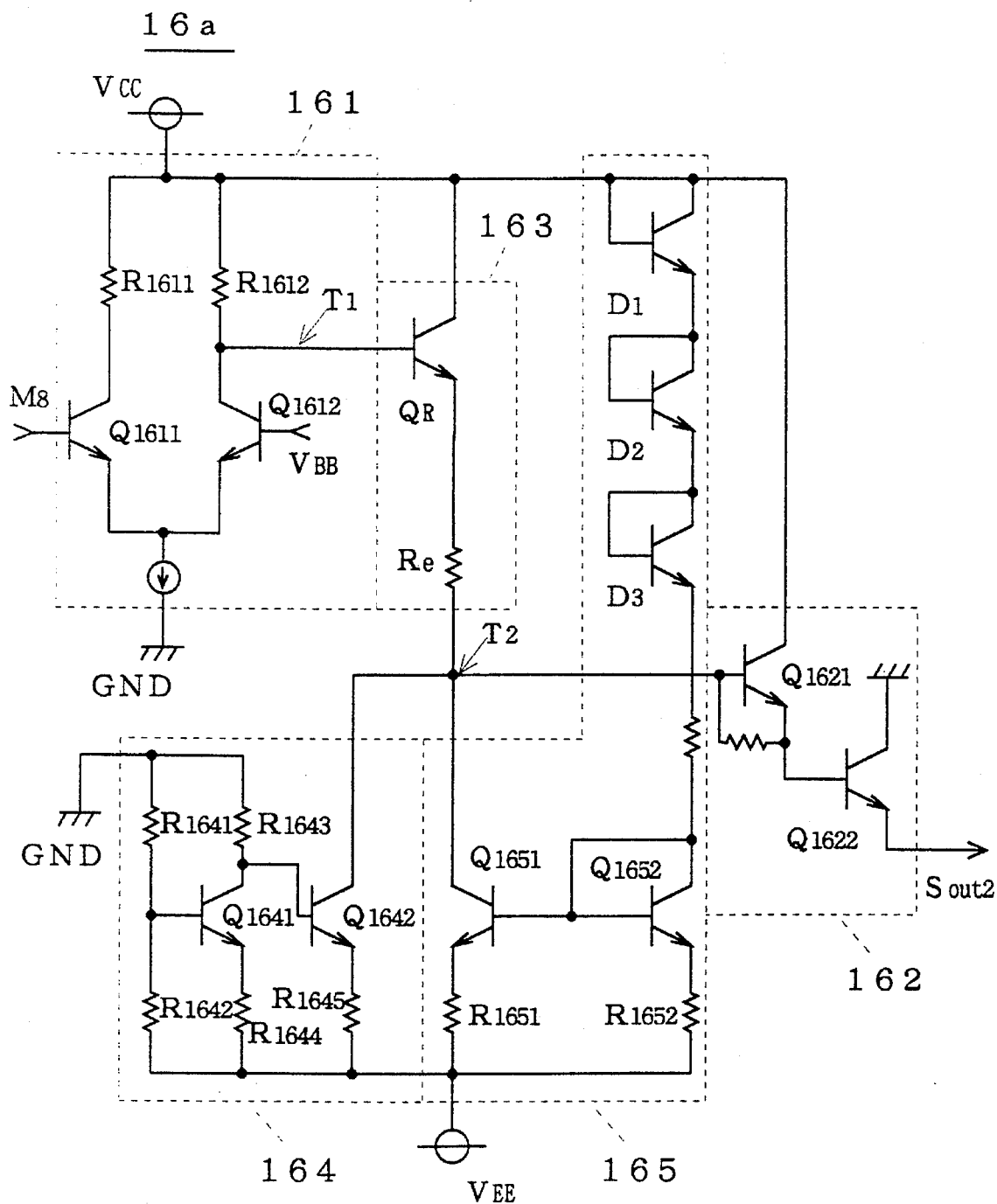
FIG. 9 is a circuit diagram of a level converter circuit 16a according to a fifth preferred embodiment of the present invention.

C. Level Converter Circuit for PECL-to-ECL Conversion (c-1) Fifth Preferred Embodiment FIG. 9 is a circuit diagram of a level converter circuit 16a which is a preferred embodiment of the level converter circuit 16 in the signal processing device 100. The level converter circuit 16a comprises a current switch 161, an output portion 162, a signal generator circuit 163, and potential variation detector circuits 164, 165.

The current switch 161 incudes transistors $Q_{1611}$, $Q_{1622}$, and resistors $R_{1611}$, $R_{1612}$. The eighth intermediate signal $M_8$ is applied to the base of the transistor $Q_{1611}$, and the reference potential $V_{BB}$ is applied to the base of the transistor $Q_{1612}$. The collector of the transistor $Q_{1611}$ is connected to a first end of the resistor $R_{1611}$, and the collector of the transistor $Q_{1612}$ is connected to a first end of the resistor $R_{1612}$. Second ends of the resistors $R_{1611}$, $R_{1622}$ are connected commonly and receive the potential $V_{CC}$. The emitters of the transistors $Q_{1611}$, $Q_{1612}$ are commonly connected to a constant current source.

The eighth intermediate signal $M_8$ is at the PECL level, and the current switch 161 functions as a buffer receiving the eighth intermediate signal $M_8$. The current switch 161 produces a first intermediate potential $T_1$.

The signal generator circuit 163 receives the first intermediate potential $T_1$ and produces a second intermediate potential $T_2$. The signal generator circuit 163 includes a regulating transistor $Q_R$, and a regulating resistor $R_e$ having a first end connected to the emitter of the regulating transistor $Q_R$. The regulating transistor $Q_R$ has a base receiving the first intermediate potential $T_1$ and a collector receiving the potential $V_{CC}$. The second intermediate potential $T_2$ is provided at a second end of the regulating resistor $R_e$.

When the eighth intermediate signal $M_8$ is a logic "H", the current witch 161 causes the first intermediate potential $T_1$ to become "H", and the base potential of the regulating transistor $Q_R$ rises. Then current flowing through the regulating resistor $R_e$ increases, and the second intermediate potential $T_2$ drops. On the other hand, when the eighth intermediate signal $M_8$ is a logic "L", the first intermediate potential $T_1$ is "L" and the second intermediate potential $T_2$ rises. In this manner, the second intermediate potential $T_2$ rises and drops depending upon the logic of the eighth intermediate signal $M_8$, and the output portion 162 outputs the second output signal $S_{out2}$ in response to the second intermediate potential $T_2$.

The output portion 162 includes transistors $Q_{1621}$ and $Q_{1622}$, and the second intermediate potential $T_2$ is applied to the base of the transistor $Q_{1621}$. The transistor $Q_{1621}$ has an emitter connected to the base of the transistor $Q_{1622}$, and a collector receiving the potential $V_{CC}$. The transistor $Q_{1622}$ has a collector grounded, and an emitter providing the second output signal $S_{out2}$. Since a signal at the ECL level is generally connected to a potential point having a $-2$ V potential through a 50 $\Omega$ terminating resistor, the transistor $Q_{1622}$ is of an open-emitter construction.

In the output portion 162 as above constructed, the transistor $Q_{1622}$ can be driven by using current flowing through the collector of the transistor $Q_{1621}$. Accordingly, a large current can be outputted. Since the collector potential of the transistor $Q_{1622}$ equals the potential GND, the potential of the second output signal $S_{out2}$ is less than 0 V. This is suitable for outputting a signal at the ECL level.

The level converter circuit 16a is designed such that variations in potentials $V_{CC}$, $V_{EE}$ do not vary the potential of the second output signal $S_{out2}$. The potential variation detector circuit 164 detects variations in potential $V_{EE}$ relative to the potential GND and the potential variation detector circuit 165 detects variations in potential $V_{CC}$ relative to the potential $V_{EE}$. Negative feedback which reduces the influence of the detected variations upon the second intermediate potential $T_2$ is provided to the second intermediate potential $T_2$, preventing variations in potential of the second output signal $S_{out2}$.

The potential variation detector circuit 164 includes two transistors $Q_{1641}$, $Q_{1642}$, and four resistors $R_{1641}$, $R_{1642}$, $R_{1643}$, $R_{1644}$. The power supplies providing the potentials $V_{CC}$, GND, $V_{EE}$ are referred to hereinafter as power supplies $V_{CC}$, GND, $V_{EE}$, respectively. The base of the transistor $Q_{1641}$ is connected to the power supply GND through the resistor $R_{1641}$, and the collector of the transistor $Q_{1641}$ is connected to the power supply GND through the resistor $R_{1643}$. The base of the transistor $Q_{1641}$ is connected to the power supply $V_{EE}$ through the resistor $R_{1642}$, and the emitter of the transistor $Q_{1641}$ is connected to the power supply $V_{EE}$ through the resistor $R_{1644}$. In such a construction, if the potential $V_{EE}$ drops, the collector current of the transistor $Q_{1641}$ increases and a voltage drop in the resistor $R_{1643}$ increases. This reduces the collector potential of the transistor $Q_{1641}$.

The transistor $Q_{1642}$ has a base connected to the collector of the transistor $Q_{1641}$, and an emitter connected to the power supply $V_{EE}$ through a resistor $R_{1645}$. When the collector potential of the transistor $Q_{1641}$ drops, the collector current of the transistor $Q_{1642}$ decreases.

The collector of the transistor $Q_{1642}$ is connected to the regulating resistor $R_e$. Thus, when the collector current of the transistor $Q_{1642}$ decreases, a voltage drop in the regulating resistor $R_e$ decreases and the second intermediate potential $T_2$ rises. Therefore, regulation of the collector current of the transistor $Q_{1642}$ permits the second intermediate potential $T_2$ to rise if the potential $V_{EE}$ drops, thereby compensating for reduction in potential $V_{EE}$. Conversely, if the potential $V_{EE}$ rises, the current through the regulating resistor $R_e$ is increased for compensation for the increment.

The potential variation detector circuit 165 includes two transistors $Q_{1651}$, $Q_{1652}$, three diodes $D_1$, $D_2$, $D_3$, and two resistors $R_{1651}$, $R_{1652}$. The three didoes $D_1$, $D_2$, $D_3$, the transistor $Q_{1652}$, and the resistor $R_{1652}$ are connected in series between the power supply $V_{CC}$ and the power supply $V_{EE}$.

The base of the transistor $Q_{1651}$ and the collector of the transistor $Q_{1652}$ are commonly connected to the base of the transistor $Q_{1652}$. The emitter of the transistor $Q_{1651}$ is connected to the power supply $V_{EE}$ through the resistor $R_{1651}$. That is, the transistors $Q_{1651}$, $Q_{1652}$ and the resistors $R_{1651}$, $R_{1652}$ form a current mirror circuit. The diodes $D_1$, $D_2$, $D_3$ are provided to prevent an excessive voltage from being applied to the transistor $Q_{1652}$.

It is now assumed that the potential $V_{CC}$ rises relative to the potential $V_{EE}$. In this case, the collector current flowing through the transistor $Q_{1652}$ increases and, accordingly, the collector current flowing through the transistor $Q_{1651}$ increases. Since the collector of the transistor $Q_{1651}$ is connected to the regulating resistor $R_e$, the increase in collector current of the transistor $Q_{1651}$ causes the voltage drop in the resistor $R_e$ to increase. Thus, the second intermediate potential $T_2$ drops. That is, negative feedback can be provided so that the second intermediate potential $T_2$ does not rise while the potential $V_{CC}$ rises. Conversely, when the potential $V_{CC}$ drops, negative feedback is provided so that the second intermediate potential $T_2$ does not drop.

In this manner, the level converter circuit 16a prevents variations in second intermediate potential $T_2$ resulting from variations in potentials $V_{EE}$ and $V_{CC}$ by means of the potential variation detector circuit 164 and signal generator circuit 163 and by means of the potential variation detector circuit 165 and signal generator circuit 163, respectively, as well as performing the conversion from the PECL level to the ECL level.

The eighth intermediate signal $M_8$ of the fifth preferred embodiment corresponds to a first signal of claim 9, and the second output signal $S_{out2}$ corresponds to a second signal. The potentials $V_{CC}$, GND, and $V_{EE}$ correspond to first, second, and third potentials, respectively. The potential variation detector circuits 164 and 165 correspond to first and second potential variation detector circuits, respectively.

(c-2) Sixth Preferred Embodiment

Figure 10:
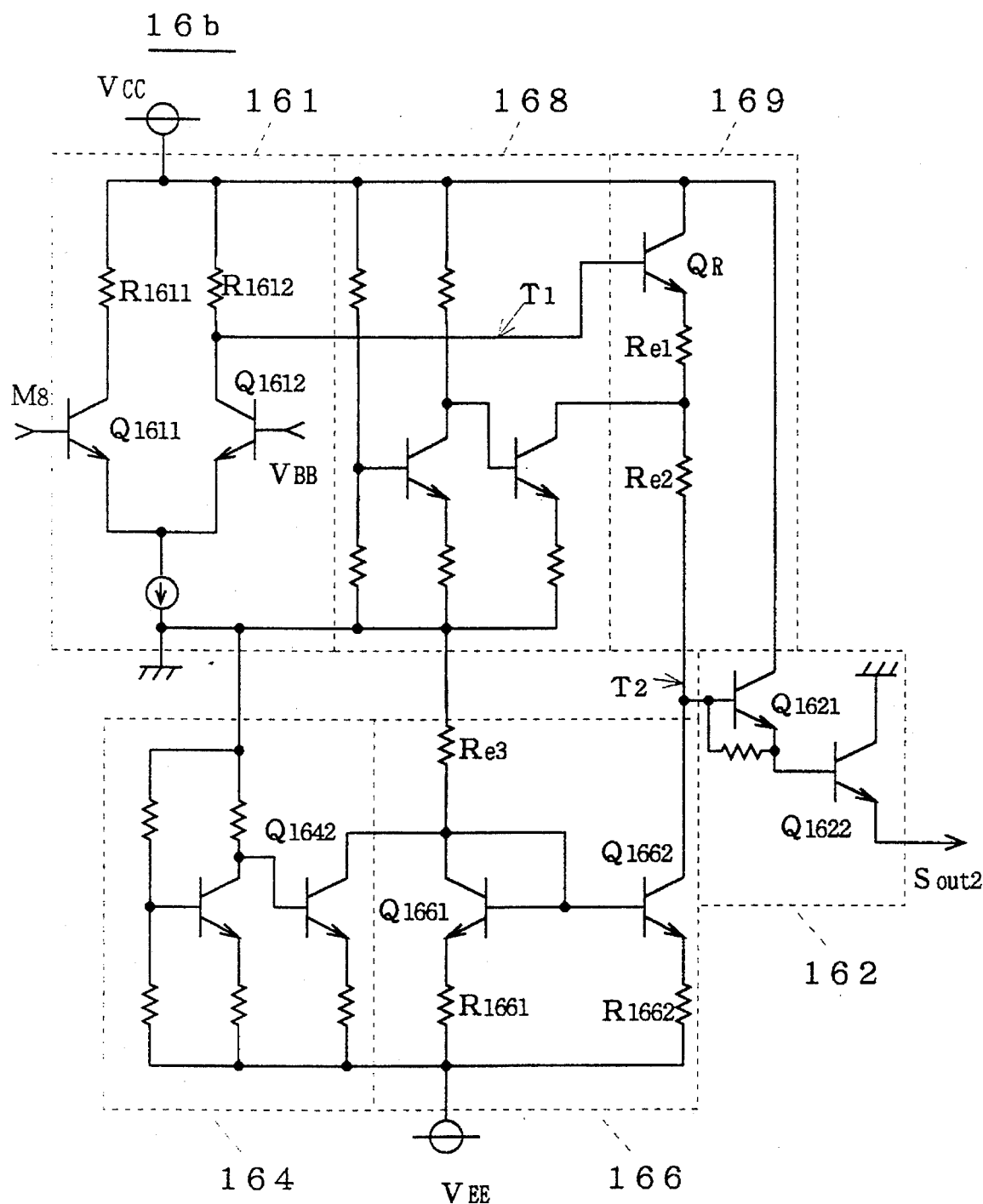
FIG. 10 is a circuit diagram of a level converter circuit 16b according to a sixth preferred embodiment of the present invention.

FIG. 10 is a circuit diagram of a level converter circuit 16b which is another preferred embodiment of the level converter circuit 16 in the signal processing device 100. The level converter circuit 16b comprises the current switch 161, the output portion 162, a signal generator circuit 169, potential variation detector circuits 164, 168, and a bias setting circuit 166.

The signal generator circuit 169 includes in-series connected first and second regulating resistors $R_{e1}$ and $R_{e2}$ into which the regulating resistor $R_e$ of the signal generator circuit 163 of the fifth preferred embodiment is divided.

In the sixth preferred embodiment, the potential variation detector circuit 164 detects variations in potential $V_{EE}$ to the potential GND, and the potential variation detector circuit 168 detects variations in potential $V_{CC}$ relative to the potential GND.

The potential variation detector circuit 168 is similar in construction to the potential variation detector circuit 164 of the fifth preferred embodiment and has an output connected to a connection point of the resistors $R_{e1}$ and $R_{e2}$. Thus, as the potential $V_{CC}$ rises relative to the potential GND, current flowing through the resistor $R_{e1}$ increases and the base potential (second intermediate potential $T_2$) of the transistor $Q_{1621}$ of the output portion drops. Conversely, as the potential $V_{CC}$ drops relative to the potential GND, the second intermediate potential $T_2$ rises. In this manner, the potential variation detector circuit 168 and the signal generator circuit 169 compensate for variations in potential $V_{CC}$ relative to the potential GND.

The bias setting circuit 166 includes two transistors $Q_{1661}$, $Q_{1662}$, two resistors $R_{1661}$, $R_{1662}$, and a regulating resistor $R_{e3}$. The base of the transistor $Q_{1662}$ and the collector of the transistor $Q_{1661}$ are commonly connected to the base of the transistor $Q_{1661}$. The emitter of the transistor $Q_{1661}$ is connected to the power supply $V_{EE}$ through the resistor $R_{1661}$, and the emitter of the transistor $Q_{1662}$ is connected to the power supply $V_{EE}$ through the resistor $R_{1662}$. That is, the transistors $Q_{1661} Q_{1662}$ and the resistors $R_{1661}$, $R_{1662}$ form a current mirror circuit. The collector of the transistor $Q_{1661}$ is connected to the regulating resistor $R_{e3}$.

The bias setting circuit 166 as above constructed receives the potential GND and the potential $V_{EE}$ and sets the collector current of the transistor $Q_{1662}$. The bias setting circuit 166 controls the current flowing through the regulating resistors $R_{e1}$ and $R_{e2}$ of the signal generator circuit to set the second intermediate potential $T_2$ to a suitable value. That is, the bias setting circuit 166 sets the second intermediate potential $T_2$ so that the output signal $S_{out2}$ is at an appropriate ECL level when the potential $V_{EE}$ has a normal value relative to the potential GND.

The regulating resistor $R_{e3}$ is connected to the collector of the transistor $Q_{1642}$ of the potential variation detector circuit 164. Thus, the collector current of the transistor $Q_{1642}$ as well as the collector current of the transistor $Q_{1661}$ flows through the regulating resistor $R_{e3}$.

It is now assumed that the potential $V_{EE}$ rises. At this time, the collector potential of the transistor $Q_{1661}$ tends to rise. The collector current of the transistor $Q_{1642}$ increases. Then the current flowing into the potential variation detector circuit 164 from the current flowing through the regulating resistor $R_{e3}$ increases, and a voltage drop in the regulating resistor $R_{e3}$ increases. This suppresses the increase in collector potential of the transistor $Q_{1661}$. Conversely, when the potential $V_{EE}$ drops, the collector potential of the transistor $Q_{1661}$ tends to drop but the decrease in the collector potential of rite transistor $Q_{1661}$ is suppressed by the operation of the potential variation detector circuit 164.

In this manner, the potential variation detector circuit 164 and the bias setting circuit 166 compensate for variations in potential $V_{EE}$ relative to the potential GND and hold the collector potential of the transistor $Q_{1661}$ constant. Thus, the current passed by the transistor $Q_{1662}$ is stable relative to the variations in potential $V_{EE}$. The second intermediate potential $T_2$ and the output signal $S_{out2}$ are accordingly stable.

A combination of the potential variation detector circuit 164 and the bias setting circuit 166 of the sixth preferred embodiment corresponds to a second potential variation detector circuit of claim 10, and the potential variation detector circuit 164 itself corresponds to a third potential variation detector circuit of claim 12.

(c-3) Seventh Preferred Embodiment

Figure 11:
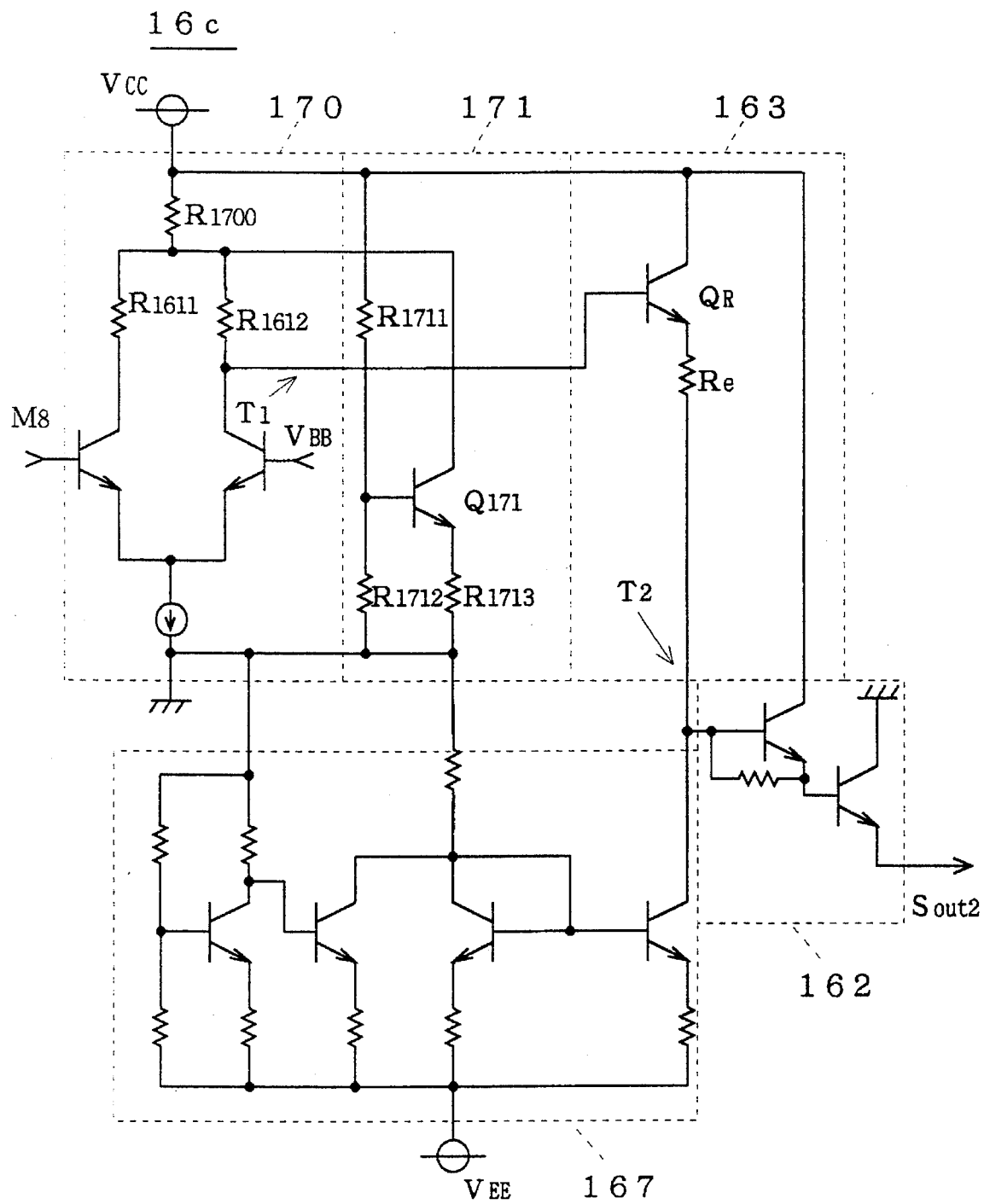
FIG. 11 is a circuit diagram of a level converter circuit 16c according to a seventh preferred embodiment of the present invention.
Figure 12:
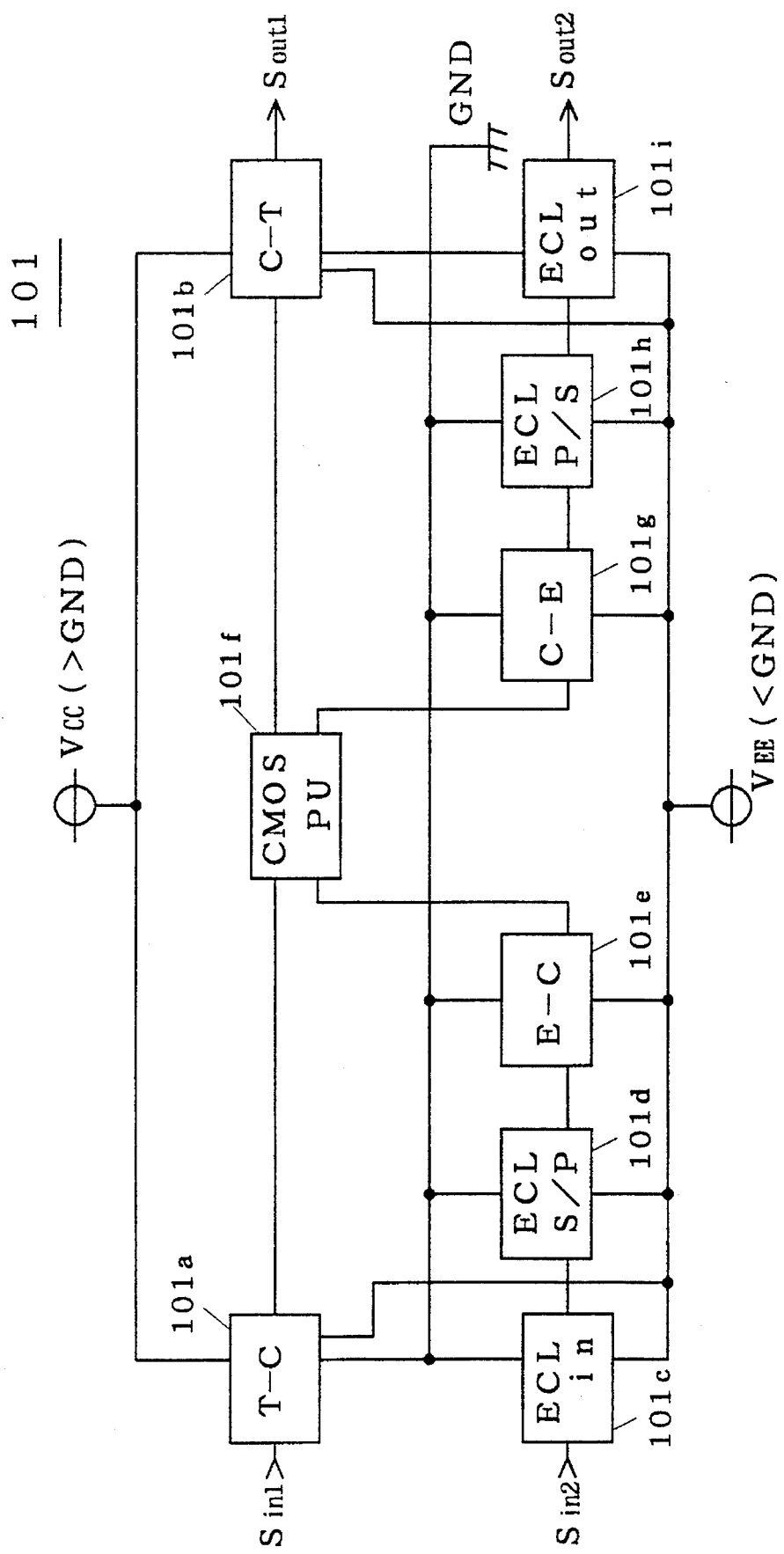
FIGS. 12 and 13 are block diagrams of the background art.
Figure 13:
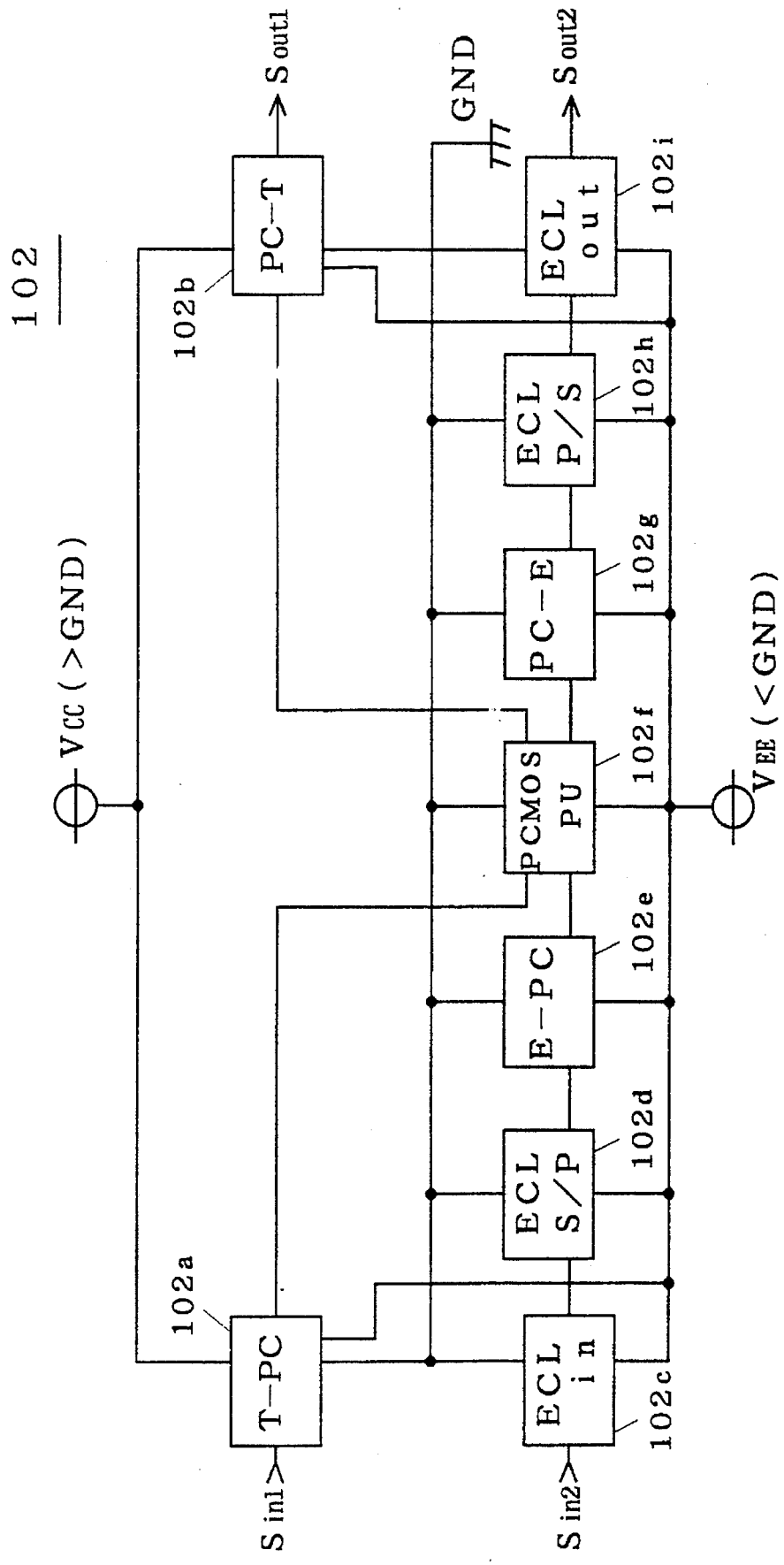

FIG. 11 is a circuit diagram of a level converter circuit 16c which is still another preferred embodiment of the level converter circuit 16 in the Signal processing device 100. The level converter circuit 16c comprises a current switch 170 substituted for the current switch 161 of the level converter circuit 16b, the signal generator circuit 163 substituted for the signal generator circuit 169 of the level converter circuit 16b, and a potential variation detector circuit 171 substituted for the potential variation detector circuit 168 of the level converter circuit 16b. In the seventh preferred embodiment, the potential variation detector circuit 164 and the bias setting circuit 166 of the sixth preferred embodiment are represented as a circuit 167.

The current switch 170 includes a resistor $R_{1700}$ in addition to the components of the current switch 161. The resistor $R_{1700}$ has a first end connected commonly to the resistors $R_{1611}$ and $R_{1612}$, and a second end connected to the power supply $V_{CC}$.

The potential variation detector circuit 171 includes a transistor $Q_{171}$ having a collector connected commonly to the resistors $R_{1700}$, $R_{1611}$, $R_{1612}$. The transistor $Q_{171}$ has a base connected to the power supply $V_{CC}$ through a resistor $R_{1711}$ and connected to the power supply GND through a resistor $R_{1712}$, and an emitter connected to the power supply GND through a resistor $R_{1713}$.

When the potential $V_{CC}$ rises relative to the potential GND, the resistors $R_{1711}$, $R_{1712}$, $R_{1713}$ cause the base potential of the transistor $Q_{171}$ to rise relative to the emitter potential thereof. This increases the collector current of the transistor $Q_{171}$ and increases a voltage drop in the resistor $R_{1700}$. Thus, the potential at the connection point of the resistors $R_{1700}$, $R_{1611}$, $R_{1612}$ drops. Conversely, when the potential $V_{CC}$ drops relative to the potential GND, the voltage drop in the resistor $R_{1700}$ decreases and the potential at the connection point of the resistors $R_{1700}$, $R_{1611}$, $R_{1612}$ rises.

In this manner, the potential variation detector circuit 171 and the resistor $R_{1700}$ of the current switch 170 compensate for the influence of variations in potential $V_{CC}$. Therefore, the first intermediate potential $T_1$ outputted from the current switch 170 is not influenced by variations in potential $V_{CC}$, and the second intermediate potential $T_2$ outputted from the signal generator circuit 163 is not influenced by variations in potential $V_{CC}$.

The potential detector circuit 167 of the seventh preferred embodiment is similar in operation to the potential variation detector circuit 164 and the bias setting circuit 166 of the sixth preferred embodiment. Thus, the stability of the second intermediate potential $T_2$ and output signal $S_{out2}$ in the case of the variations in potential $V_{EE}$ relative to the potential GND of the seventh preferred embodiment is similar in effect to that of the sixth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A signal processing device receiving a first input signal having a TTL level and a second input signal having an ECL level for performing signal processing at a CMOS level to provide a first output signal having the TTL level and a second output signal having the ECL level, said signal processing device comprising:

(a) a first level converter circuits for level converting said first input signal into a first intermediate signal at the CMOS level;

(b) a second level converter circuit for level converting said second input signal into a second intermediate signal at a pseudo-ECL level;

(c) a pre-processing circuit for serial-to-parallel converting said second intermediate signal to produce a third intermediate signal at the pseudo-ECL level;

(d) a third level converter circuit for level converting said third intermediate signal into a fourth intermediate signal at the CMOS level;

(e) a signal processing circuit for performing predetermined signal processing on said first intermediate signal and said fourth intermediate signal to produce a fifth intermediate signal and a sixth intermediate signal both at the CMOS level in respective corresponding relation to said first and fourth intermediate signals;

(f) a fourth level converter circuit for level converting said fifth intermediate signal into said first output signal;

(g) a fifth level converter circuit for level converting said sixth intermediate signal into a seventh intermediate signal at the pseudo-ECL level;

(h) a post-processing circuit for parallel-to-serial converting said seventh intermediate signal to produce an eighth intermediate signal at the pseudo-ECL level; and (i) a sixth level converter circuit for level converting said eighth intermediate signal into said second output signal.

2. The signal processing device of claim 1, said signal processing device also receiving a third input signal at the TTL level having a frequency lower than the frequency of said second input signal for performing signal processing at the CMOS level to provide a third output signal having the TTL level, said signal processing device further comprising:

(j) a seventh level converter circuit for level converting said third input signal into a ninth intermediate signal at the CMOS level; and (k) an eighth level converter circuit receiving a tenth intermediate signal at the CMOS level for level converting the tenth intermediate signal into said third output signal, wherein said signal processing circuit also receives said ninth intermediate signal and performs said signal processing upon said ninth intermediate signal to produce said tenth intermediate signal.

3. A level converter circuit for converting a first signal at an ECL level into a second signal at a pseudo ECL level, said level converter circuit comprising:

(a) first, second, and third power supplies for providing a first potential, a second potential lower than said first potential, and a third potential lower than said second potential, respectively;

(b) a voltage-to-current converting portion between said second power supply and said third power supply and receiving a potential of said first signal for producing a conversion current varying in response to a variation in said potential of said first signal;

(c) a current-to-voltage converting portion connected to said first power supply for converting said conversion current into a first intermediate potential varying within a predetermined range;

(d) a first voltage follower circuit receiving said first intermediate potential for outputting a second intermediate potential;

(e) a current switch receiving said second intermediate potential for outputting a third intermediate potential; and (f) a second voltage follower circuit receiving said third intermediate potential for outputting said second signal.

4. The level converter circuit of claim 3, wherein said voltage-to-current converting portion includes:

(b-1) an input transistor having a base receiving said first signal, an emitter connected to said third power supply, and a collector; and (b-2) a conversion transistor having a base connected to said second power supply, an emitter connected to said collector of said input transistor, and a collector feeding said conversion current.

5. The level converter circuit of claim 3, wherein said voltage-to-current converting portion includes:

(b-1) a first transistor having a collector, an emitter, and a base receiving said first signal;

(b-2) a second transistor having a base receiving a reference potential, an emitter connected to said emitter of said first transistor, and a collector;

(b-3) a resistor connected between said collector of said second transistor and said second power supply;

(b-4) a constant current source connected commonly to said emitter of said first transistor and said emitter of said second transistor;

(b-5) a conversion transistor having an emitter connected to said collector of said first transistor, a base connected to said second power supply, and a collector carrying said conversion current; and (b-6) a third transistor having a source connected to said base of said conversion transistor, a drain connected to said emitter of said conversion transistor, and a gate connected to said collector of said second transistor.

6. The level converter circuit of claim 3, wherein said current switch includes:

(e-1) a first transistor having a collector, an emitter, and a base receiving said second intermediate potential;

(e-2) a second transistor having a collector receiving said third intermediate potential, an emitter connected to said emitter of said first transistor, and a base receiving a reference potential;

(e-3) a first resistor connected between said collector of said first transistor and said first power supply;

(e-4) a second resistor, connected between said collector of said second transistor and said first power supply; and (e-5) a constant current source connected commonly to said emitter of said first transistor and said emitter of said second transistor, and wherein said current-to-voltage converting portion includes:

(c-1) a diode having an anode connected to said first power supply and a cathode receiving said first intermediate potential; and (c-2) a third transistor having a source connected to said anode of said diode, a drain connected to said cathode of said diode, and a gate connected to said collector of said first transistor.

7. The level converter circuit of claim 6, wherein said voltage-to-current converting portion includes:

(b-1) a fourth transistor having a gate receiving said first signal, a source connected to said third power supply, and a drain; and (b-2) a third resistor connected between said drain of said fourth transistor and said second power supply.

8. The level converter circuit of claim 7, wherein said voltage-to-current converting portion further includes:
- (b-3) a fourth resistor connected between said third resistor and said current-to-voltage converting portion.

9. A level converter circuit for converting a first signal at a pseudo-ECL level into a second signal at an ECL level, said level converter circuit comprising:
- (a) first, second, and third power supplies for providing a first potential, a second potential lower than said first potential, and a third potential lower than said second potential, respectively;
- (b) a current switch between said first power supply and said second power supply and receiving said first signal for producing a first intermediate potential;
- (c) a signal generator circuit including
    - (c-1) a regulating transistor having an emitter, a base receiving said first intermediate potential, and a collector connected to said first power supply, and
    - (c-2) a regulating resistor having a first end, and a second end connected to said emitter of said regulating transistor, said signal generator circuit outputting a second intermediate potential at said first end of said regulating resistor;
- (d) an output portion receiving said second intermediate potential for outputting said second signal;
- (e) a first potential variation detector circuit between said second power supply and said third power supply for applying a first current to said regulating resistor, said first current varying in response to a variation in said third potential relative to said second potential; and
- (f) a second potential variation detector circuit between said first power supply and said third power supply for applying a second current to said regulating resistor, said second current varying in response to a variation in said first potential relative to said third potential.

10. A level converter circuit for converting a first signal at a pseudo-ECL level into a second signal at an ECL level, said level converter circuit comprising:
- (a) first, second, and third power supplies for providing a first potential, a second potential lower than said first potential, and a third potential lower than said second potential, respectively;
- (b) a current switch between said first power supply and said second power supply and receiving said first signal for producing a first intermediate potential;
- (c) a signal generator circuit including
    - (c-1) a regulating transistor having an emitter, a base receiving said first intermediate potential, and a collector connected to said first power supply,
    - (c-2) a first regulating resistor having a first end, and a second end connected to said emitter of said regulating transistor, and
    - (c-3) a second regulating resistor having a first end, and a second end connected to said first end of said first regulating resistor, said signal generator circuit outputting a second intermediate potential at said first end of said second regulating resistor;
- (d) an output portion receiving said second intermediate potential for outputting said second signal;
- (e) a first potential variation detector circuit between said first power supply and said second power supply for applying a first current to said first regulating resistor, said first current varying in response to a variation in said first potential relative to said second potential; and
- (f) a second potential variation detector circuit between said second power supply and said third power supply for applying a second current to said second regulating resistor, said second current varying in response to a variation in said third potential relative to said second potential.

11. A level converter circuit for converting a first signal at a pseudo-ECL level into a second signal at an ECL level, said level converter circuit comprising:
- (a) first, second, and third power supplies for providing a first potential, a second potential lower than said first potential, and a third potential lower than said second potential, respectively;
- (b) a current switch between said first power supply and said second power supply and receiving said first signal for producing a first intermediate potential;
- (c) a signal generator circuit including
    - (c-1) a regulating transistor having an emitter, a base receiving said first intermediate potential, and a collector connected to said first power supply, and
    - (c-2) a first regulating resistor having a first end, and a second end connected to said emitter of said regulating transistor, said signal generator circuit outputting a second intermediate potential at said first end of said first regulating resistor;
- (d) an output portion receiving said second intermediate potential for outputting said second signal;
- (e) a second regulating resistor connected between said first power supply and said current switch;
- (f) a first potential variation detector circuit between said first power supply and said second power supply for applying a first current to said second regulating resistor, said first current varying in response to a variation in said first potential relative to said second potential; and
- (g) a second potential variation detector circuit between said second power supply and said third power supply for applying a second current to said first regulating resistor, said second current varying in response to a variation in said third potential relative to said second potential.

12. The level converter circuit of claim 10, wherein said second potential variation detector circuit includes:
- (f-1) a bias setting circuit including:
    - (f-1-1) a current mirror circuit having a first branch, and a second branch feeding current proportional to current flowing through said first branch, said first branch and said second branch being connected commonly to said third power supply, and
    - (f-1-2) a third regulating resistor connected between said first branch of said current mirror circuit and said second power supply; and
- (f-2) a third potential variation detector circuit between said second power supply and said third power supply for drawing current responsive to a variation in said third potential from said third regulating resistor.

13. The level converter circuit of claim 11, wherein said second potential variation detector circuit includes:
- (f-1) a bias setting circuit including:

(f-1-1) a current mirror circuit having a first branch, and a second branch feeding current proportional to current flowing through said first branch, said first branch and said second branch being connected commonly to said third power supply, and
(f-1-2) a third regulating resistor connected between said first branch of said current mirror circuit and said second power supply; and
(f-2) a third potential variation detector circuit between said second power supply and said third power supply for drawing current responsive to a variation in said third potential from said third regulating resistor.

14. The level converter circuit of claim 9,
wherein said output portion includes:
   (d-1) a first output transistor having a base receiving said second intermediate potential, a collector connected to said first power supply, and an emitter; and
   (d-2) a second output transistor having a base connected to said emitter of said first output transistor, a collector connected to said second power supply, and an emitter outputting said second signal.

15. The level converter circuit of claim 10,
wherein said output portion includes:
   (d-1) a first output transistor having a base receiving said second intermediate potential, a collector connected to said first power supply, and an emitter; and
   (d-2) a second output transistor having a base connected to said emitter of said first output transistor, a collector connected to said second power supply, and an emitter outputting said second signal.

16. The level converter circuit of claim 11,
wherein said output portion includes:
   (d-1) a first output transistor having a base receiving said second intermediate potential, a collector connected to said first power supply, and an emitter; and
   (d-2) a second output transistor having a base connected to said emitter of said first output transistor, a collector connected to said second power supply, and an emitter outputting said second signal.

* * * * *